(12) United States Patent
Kang

(10) Patent No.: US 10,868,039 B2
(45) Date of Patent: Dec. 15, 2020

(54) MANUFACTURING METHOD OF A SEMICONDUCTOR DEVICE

(71) Applicant: SK hynix Inc., Icheon-si (KR)

(72) Inventor: Byung Woo Kang, Incheon (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/511,955

(22) Filed: Jul. 15, 2019

(65) Prior Publication Data
US 2020/0168629 A1 May 28, 2020

(30) Foreign Application Priority Data
Nov. 22, 2018 (KR) .................. 10-2018-0145789

(51) Int. Cl.
| | | |
|---|---|---|
| *H01L 21/00* | (2006.01) | |
| *H01L 27/00* | (2006.01) | |
| *H01L 27/11582* | (2017.01) | |
| *H01L 21/311* | (2006.01) | |
| *H01L 21/02* | (2006.01) | |
| *H01L 27/11573* | (2017.01) | |

(52) U.S. Cl.
CPC .... *H01L 27/11582* (2013.01); *H01L 21/0217* (2013.01); *H01L 21/02129* (2013.01); *H01L 21/02532* (2013.01); *H01L 21/02636* (2013.01); *H01L 21/31111* (2013.01); *H01L 27/11573* (2013.01)

(58) Field of Classification Search
CPC .......... H01L 21/02129; H01L 21/0217; H01L 21/02532; H01L 21/02636; H01L 21/31111; H01L 27/11582; H01L 27/11573; H01L 27/11524; H01L 27/11556; H01L 27/1157
See application file for complete search history.

(56) References Cited

U.S. PATENT DOCUMENTS

| | | | |
|---|---|---|---|
| 8,530,959 B2* | 9/2013 | Chang ............... | H01L 27/11551 257/315 |
| 9,991,271 B2* | 6/2018 | Kang ................ | H01L 27/11575 |
| 2012/0043673 A1* | 2/2012 | Chang ............... | H01L 29/66833 257/786 |
| 2017/0358590 A1* | 12/2017 | Kang ................ | H01L 27/11524 |

FOREIGN PATENT DOCUMENTS

KR    1020140134178 A    11/2014

* cited by examiner

*Primary Examiner* — Nikolay K Yushin
(74) *Attorney, Agent, or Firm* — William Park & Associates Ltd.

(57) ABSTRACT

A manufacturing method of a semiconductor device is provided. The method includes forming a sacrificial layer with different material layers, and etching the sacrificial layer.

22 Claims, 19 Drawing Sheets

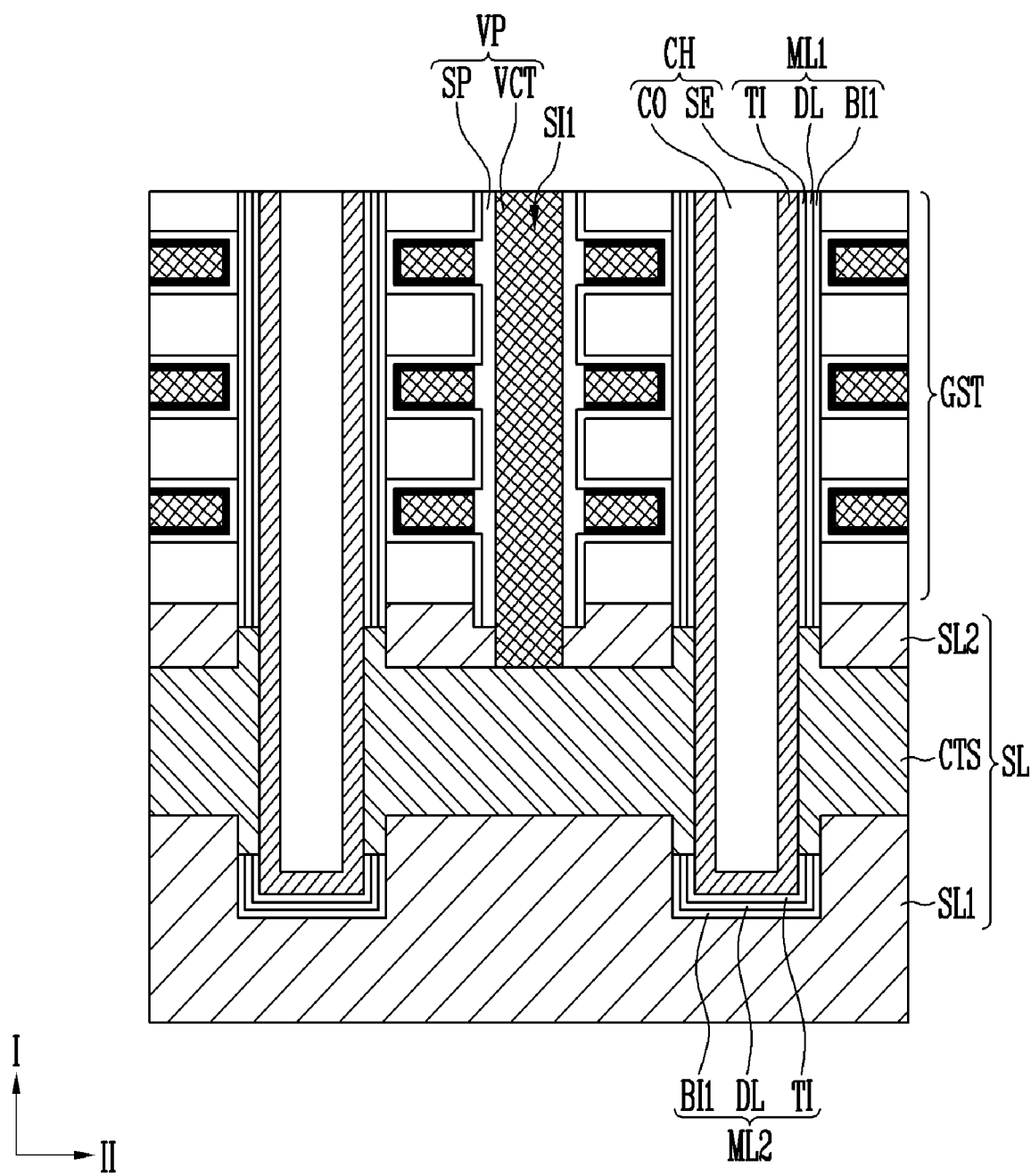

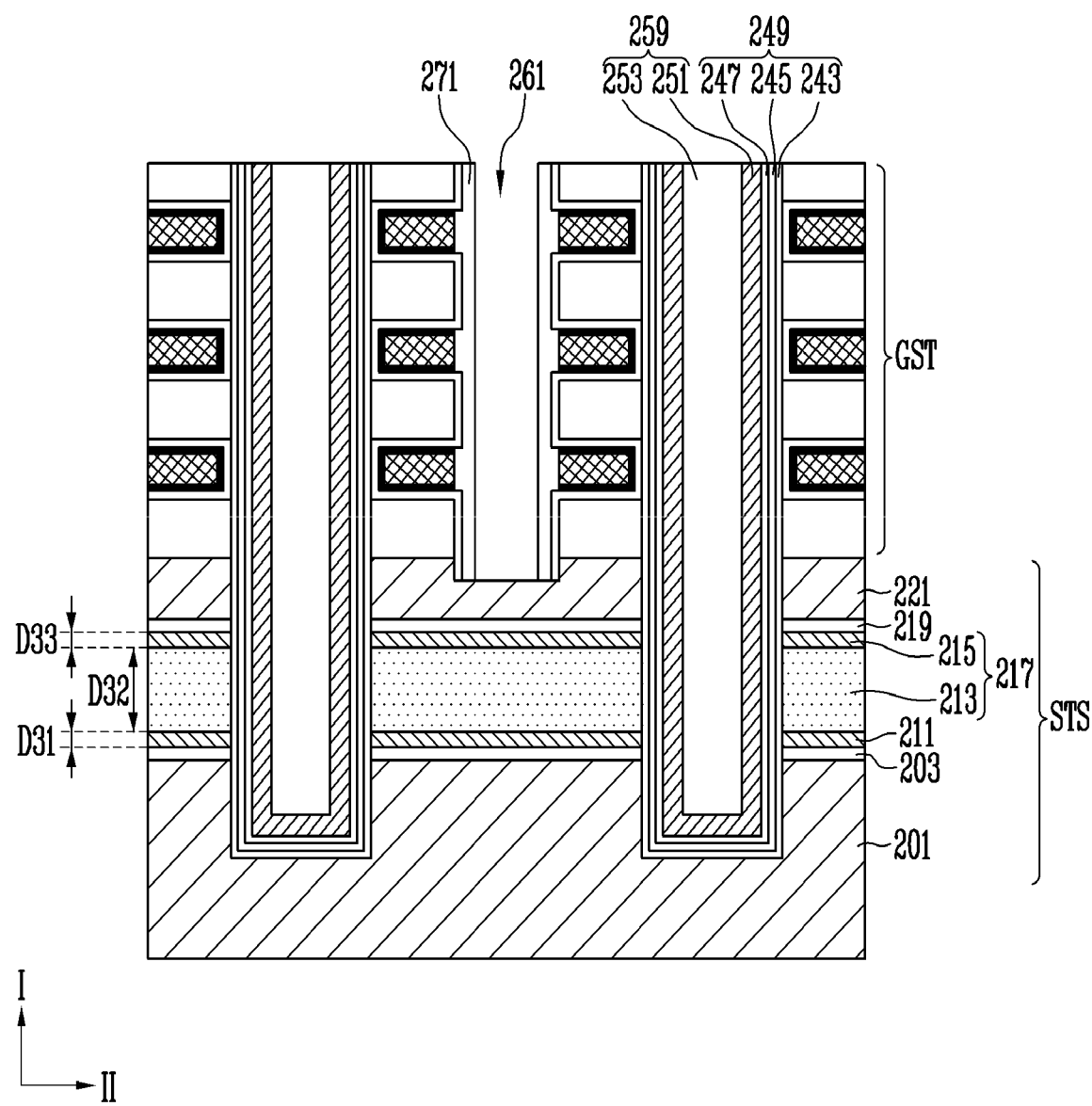

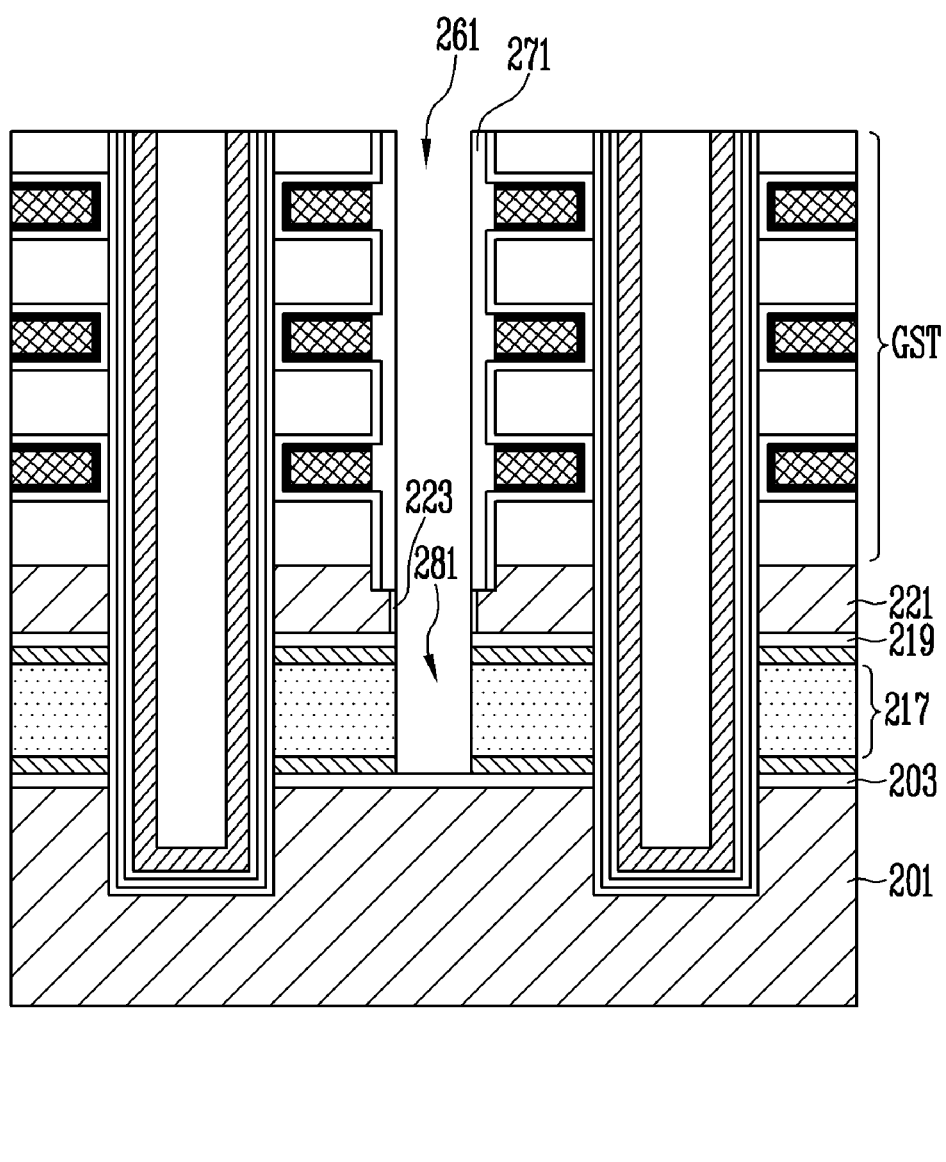

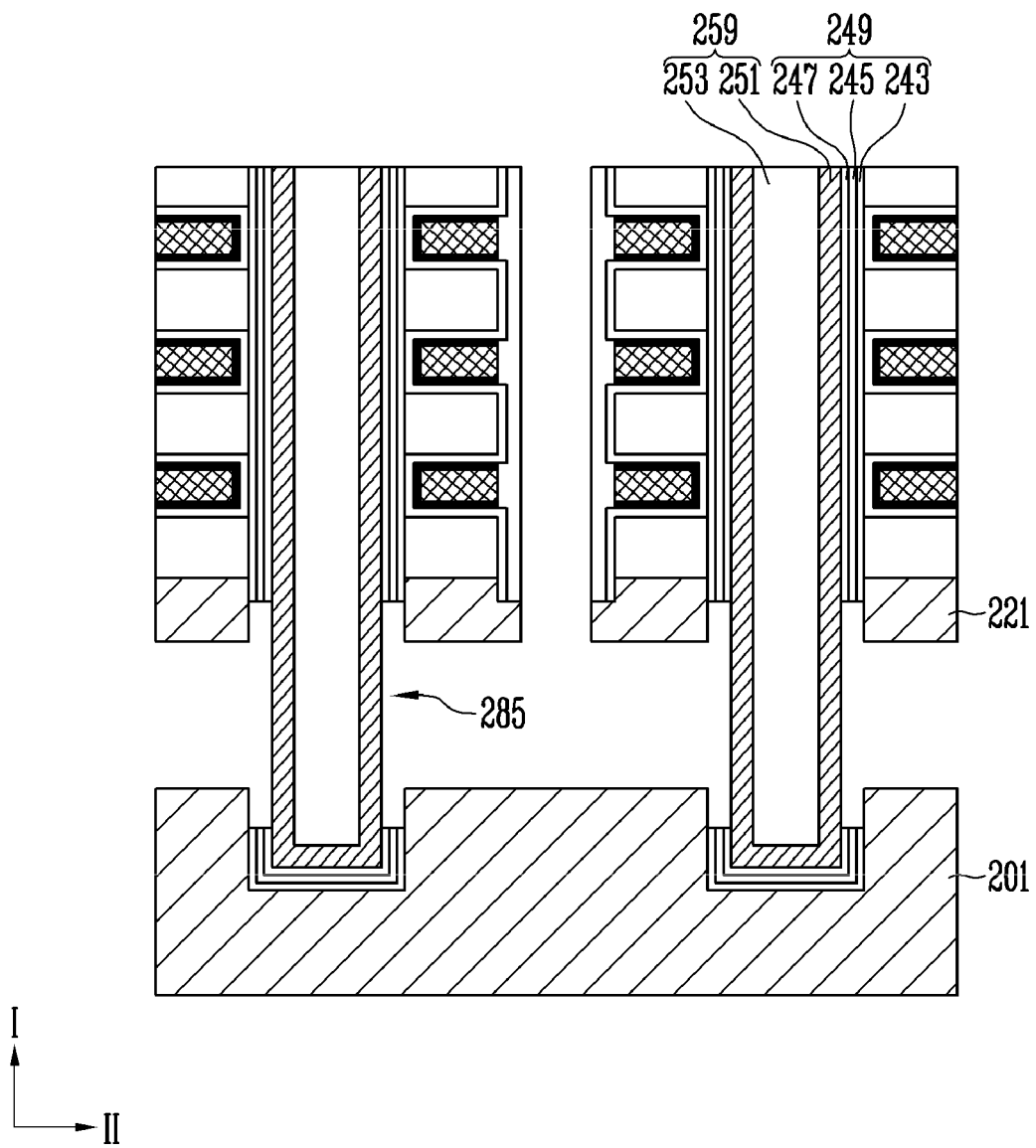

MANUFACTURING METHOD OF A SEMICONDUCTOR DEVICE

CROSS-REFERENCE TO RELATED APPLICATION

The present application claims priority under 35 U.S.C. § 119(a) to Korean patent application number 10-2018-0145789, filed on Nov. 22, 2018, the entire disclosure of which is incorporated herein by reference in its entirety.

BACKGROUND

1. Technical Field

The present disclosure generally relates to a manufacturing method of a semiconductor device, and more particularly, to a manufacturing method of a semiconductor device including a plurality of material layers.

2. Related Art

A semiconductor device may include a memory cell array including a plurality of memory cells. The memory cell array may include memory cells arranged in various structures. In order to improve the degree of integration of the semiconductor device, the memory cells may be three-dimensionally arranged on a substrate. A stack structure in which a plurality of material layers are stacked may be used to manufacture the three-dimensionally arranged memory cells.

SUMMARY

According to an aspect of the present disclosure, there is provided a method of manufacturing a semiconductor device, the method may include: forming a first material layer on a lower layer; forming a second material layer on the first material layer; forming a third material layer on the second material layer; forming an upper layer on the third material layer; forming a slit penetrating the upper layer and the first to third material layers; and etching the first to third material layers through the slit, wherein the first and third material layers are etched more quickly than the second material layer such that a first gap is formed between the upper layer and the second material layer and a second gap is formed between the lower layer and the second material layer.

According to an aspect of the present disclosure, there is provided a method of manufacturing a semiconductor device, the method may include: forming a stack structure in which an interlayer insulating layer and a multi-sacrificial layer are alternately stacked, wherein the multi-sacrificial layer is formed by stacking a first material layer and a second material layer; forming channel structures penetrating the stack structure; forming a slit penetrating the stack structure between the channel structures; etching the multi-sacrificial layer through the slit, wherein the first material layer is etched more quickly than the second material layer; and filling a region in which the multi-sacrificial layer is removed with a conductive pattern.

According to an aspect of the present disclosure, there is provided a method of manufacturing a semiconductor device, the method may include: forming a stack structure in which a source layer and a multi-sacrificial layer are alternately stacked, wherein the multi-sacrificial layer is formed by stacking a first material layer and a second material layer; forming gate stack structures penetrated by channel structures on the stack structure; forming a slit penetrating the multi-sacrificial layer exposed between the gate stack structures; etching the multi-sacrificial layer, wherein the first material layer is etched more quickly than the second material layer; and filling a region in which the multi-sacrificial layer is removed with a contact source layer.

BRIEF DESCRIPTION OF THE DRAWINGS

FIG. 7 is a sectional view illustrating gate stack structures and a source layer of a semiconductor device according to an embodiment.

FIGS. 8A to 8F are sectional views illustrating a manufacturing method of a semiconductor device according to an embodiment.

DETAILED DESCRIPTION

Figure 1A:
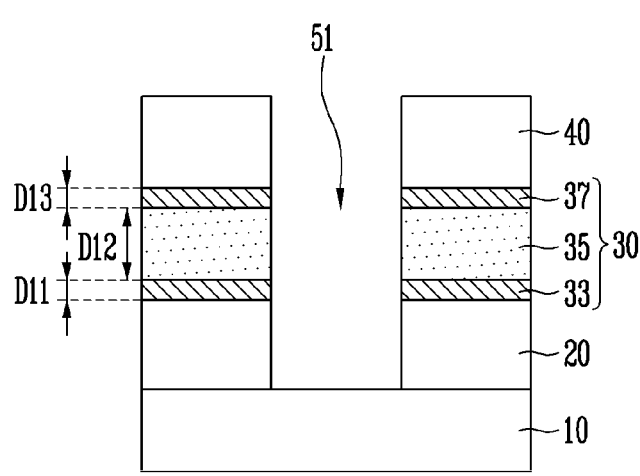
FIGS. 1A to 1E are process sectional views illustrating a manufacturing method of a semiconductor device according to an embodiment.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element, or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

The terms used in the present application are used to describe particular embodiments and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Embodiments may provide a manufacturing method of a semiconductor device, which can reduce the manufacturing time of the semiconductor device.

FIGS. 1A to 1E are process sectional views illustrating a manufacturing method of a semiconductor device according to an embodiment. FIGS. 1A to 1E illustrate a manufacturing method of a semiconductor device, using a replace process, when the semiconductor device including a pattern disposed between a lower layer and an upper layer is manufactured.

Referring to FIG. 1A, a lower layer 20, a multi-sacrificial layer 30, and an upper layer 40 may be sequentially formed on a substrate 10. The lower layer 20 and the upper layer 40 may be formed of a material different from that of the multi-sacrificial layer 30.

The multi-sacrificial layer 30 may include a first material layer 33, a second material layer 35, and a third material layer 37, which are sequentially stacked.

The second material layer 35 may be formed of a material different from those of the first material layer 33 and the third material layer 37, and the third material layer 37 may be formed of the same material as the first material layer 33. In an embodiment, the second material layer 35 may be formed of a material having an etch rate different from those of the first material layer 33 and the third material layer 37. Any one of the first material layer 33 and the third material layer 37 may be omitted.

The second material layer 35 may be formed to have a greater thickness D12 than the thickness D11 of the first material layer 33. The second material layer 35 may be formed to have a greater thickness D12 than the thickness D13 of the third material layer 37. In a subsequent process, the first material layer 33 and the third material layer 37 may be removed at a relatively higher speed than the second material layer 35.

Subsequently, a slit 51 penetrating the upper layer 40, the multi-sacrificial layer 30, and the lower layer 20 may be formed by etching the upper layer 40, the multi-sacrificial layer 30, and the lower layer 20.

Figure 1B:
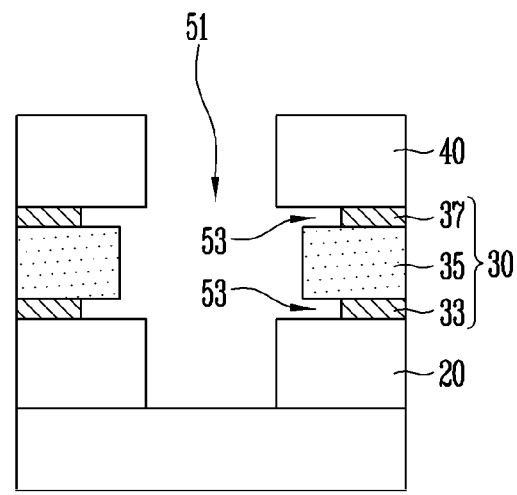

Referring to FIG. 1B, the multi-sacrificial layer 30 may be etched through the slit 51, using an etching material for etching the first and third material layers 33 and 37 more quickly than the second material layer 35. The upper layer 40 and the lower layer 20 have a high etching resistance with respect to the etching material, and therefore, the multi-sacrificial layer 30 may be selectively removed during the etching process.

While the multi-sacrificial layer 30 is being selectively etched, the first and third material layers 33 and 37 are etched more quickly than the second material layer 35 due to a difference in etching speed between the first to third material layers 33, 35, and 37. In an embodiment, the first and third material layers 33 and 37 have a higher etching rate than the second material layer 35. Accordingly, while the etching process is being performed, gaps 53 may be respectively formed between the upper layer 40 and the second material layer 35 (i.e., first gap) and between the lower layer 20 and the second material layer 35 (i.e., second gap). The surface area of the second material layer 35 exposed to the etching material may be enlarged by the gap 53 while the etching process is being performed.

For example, each of the first material layer 33 and the third material layer 37 may include at least one of a Boron Phosphorus Silicate Glass (BPSG), an Undoped Silicate Glass (USG), a Phosphorus Silicate Glass (PSG), and a porous nitride layer, and the second material layer 35 may include a silicon nitride layer. In some embodiments, the etching material may include phosphoric acid ($H_3PO_4$). In other embodiments, the etching material may include other etching materials different from phosphoric acid ($H_3PO_4$). When the BPSG, the USG, the PSG, and the silicon nitride layer are etched by using phosphoric acid ($H_3PO_4$), each of the BPSG, the USG, and the PSG may be etched more quickly than the silicon nitride layer because each of the BPSG, the USG, and the PSG has a higher etching rate than the silicon nitride layer. Since the porous nitride layer has a density lower than that of the silicon nitride layer, the porous nitride layer may be etched more quickly than the silicon nitride layer.

In an embodiment, each of the first material layer 33 and the third material layer 37 may include doped silicon, and the second material layer 35 may include undoped silicon. The etching material may be configured with a chemical material including hydrogen fluoride (HF), nitric acid ($HNO_3$), and acetic acid ($CH_3COOH$). The doped silicon may be etched by the chemical material more quickly than the undoped silicon.

Figure 1C:
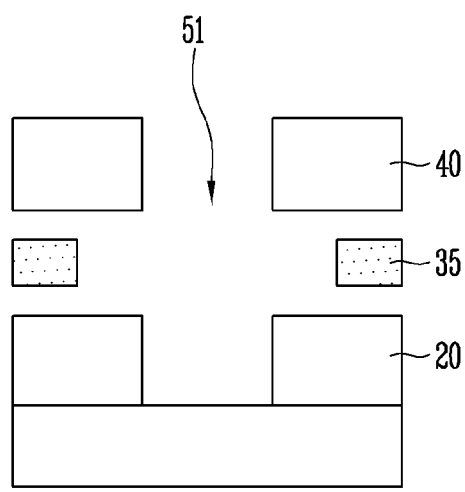

Referring to FIG. 1C, the first and third material layers 33 and 37 shown in FIG. 1B may be removed before the second material layer 35 is completely removed, and the etching speed of the second material layer 35 may be increased due to the increase in surface area of the second material layer 35 exposed to the etching material. In an embodiment, as the first and third material layers 33 and 37 are removed more surface area of the second material layer 35 is exposed to allow greater amounts of the etching material to interact with the second material layer, thus reducing the time needed to remove the second material layer 35.

Figure 1D:
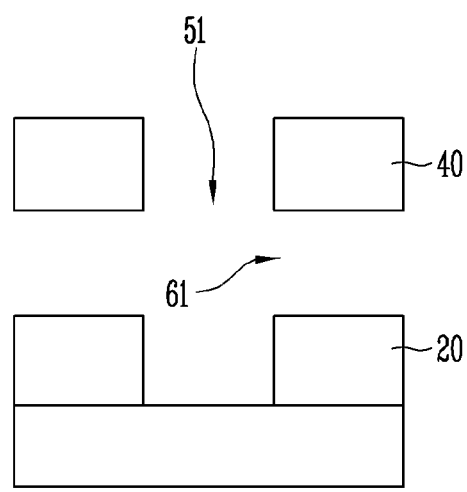

Referring to FIG. 1D, the second material layer 35 shown in FIG. 1C is removed, so that an interlayer space 61 is defined between the upper layer 40 and the lower layer 20. According to an embodiment, the removal speed of the multi-sacrificial layer is increased by enlarging the surface area of the multi-sacrificial layer exposed to the etching material, so that the manufacturing time of the semiconductor device can be reduced. In some embodiments, opening the interlayer spaces 61 means creating a space between the upper layer 40 and the lower layer 20 after etching at least one of the first, second, and third material layers 33, 35, and 37. In other embodiments, opening the interlayer spaces 61 means creating a space between the upper layer 40 and the lower layer 20 after etching the multi-sacrificial layer 30 so that a fourth material layer 63 may be formed between the upper layer 40 and the lower layer 20 (See FIG. 1E). In other embodiments, opening the interlayer spaces 61 means removing enough of the multi-sacrificial layer 30 so that an opening may be defined by the upper layer 40 and the lower layer 20. For example, opening the interlayer spaces 61 means removing the multi-sacrificial layer 30 such that at least one surface from a surface of the upper layer 40, and the lower layer 20 is exposed.

Figure 1E:
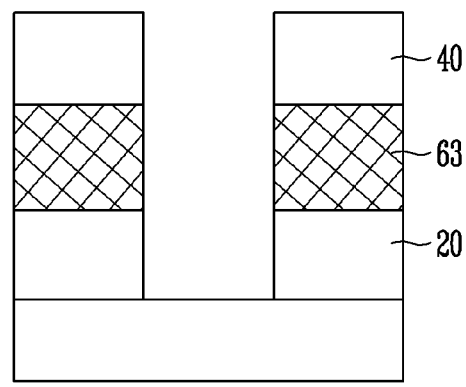

Referring to FIG. 1E, the interlayer space 61 shown in FIG. 1D may be filled with the fourth material layer 63. The lower layer 20, the fourth material layer 63, and the upper layer 40 may be formed of a combination of various materials.

In a manufacturing method according to an embodiment of the present disclosure, which includes a replacement process of replacing the multi-sacrificial layer with the fourth material layer through the slit, the multi-sacrificial layer may be formed with material layers, which may have different etching speeds from each other, so that the removal speed of the multi-sacrificial layer can be increased.

Although not shown in the drawings, the multi-sacrificial layer may be formed to fill a trench extending in a vertical direction or a hole extending in the vertical direction. The multi-sacrificial layer may be removed in a process of opening the trench or the hole.

Hereinafter, various embodiments of the semiconductor device formed using the above-described manufacturing method will be described.

Figure 2A:
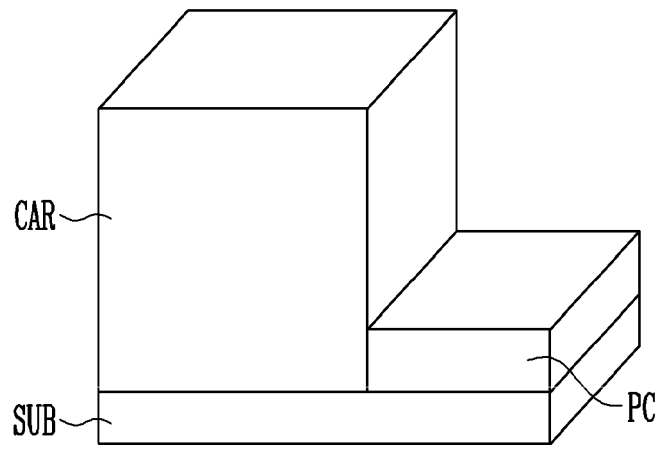
FIGS. 2A and 2B are block diagrams schematically illustrating semiconductor devices according to embodiments.
Figure 2B:
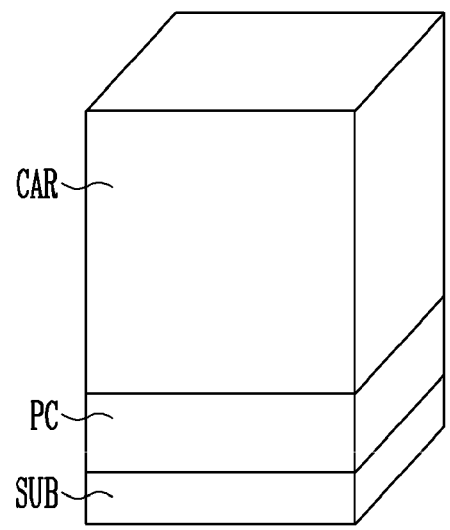

FIGS. 2A and 2B are block diagrams schematically illustrating semiconductor devices according to embodiments.

Referring to FIGS. 2A and 2B, each of the semiconductor devices may include a peripheral circuit structure PC and a cell array CAR, which are disposed on a substrate SUB.

The substrate SUB may be a single crystalline semiconductor layer. For example, the substrate SUB may be a silicon on insulator substrate, a germanium substrate, a germanium on insulator substrate, a silicon-germanium substrate, or an epitaxial thin film formed through a selective epitaxial growth process.

The cell array CAR may include a plurality of memory blocks. Each of the memory blocks may include a plurality of cell strings. Each of the cell strings may be electrically connected to a bit line, a source line, word lines, and select lines. Each of the cell strings may include memory cells and select transistors, which are coupled in series. Each of the select lines is used as a gate electrode of a select transistor corresponding thereto, and each of the word lines is used as a gate electrode of a memory cell corresponding thereto.

The peripheral circuit structure PC may include NMOS and PMOS transistors, a resistor, and a capacitor, which are electrically connected to the cell array CAR. The NMOS and PMOS transistors, the resistor, and the capacitor may be used as elements that constitute a row decoder, a column decoder, a page buffer, and a control logic.

As shown in FIG. 2A, the peripheral circuit structure PC may be disposed on a partial region of the substrate SUB, which does not overlap with the cell array CAR.

Alternatively, as shown in FIG. 2B, the peripheral circuit structure PC may be disposed between the cell array CAR and the substrate SUB. The peripheral circuit structure PC overlaps with the cell array CAR, and thus the area of the substrate SUB occupied by the cell array CAR and the peripheral circuit structure PC can be reduced.

Figure 3:
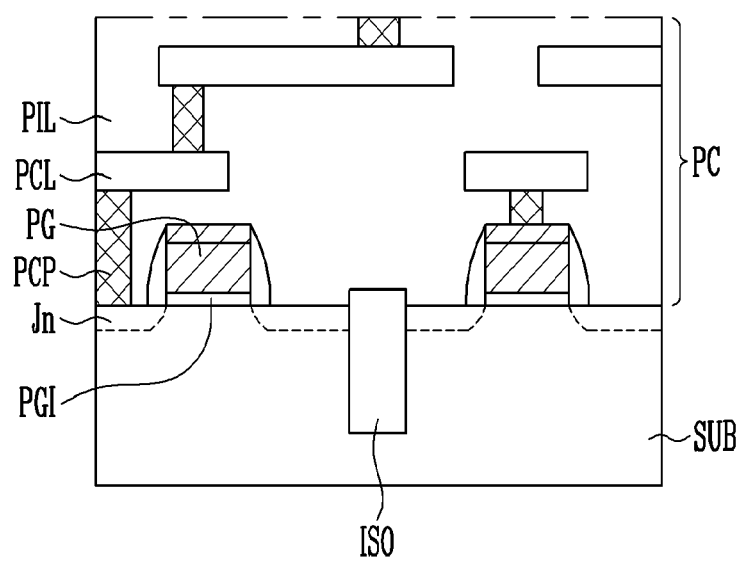
FIG. 3 is a sectional view schematically illustrating a peripheral circuit structure.

FIG. 3 is a sectional view schematically illustrating a peripheral circuit structure PC. The peripheral circuit structure PC shown in FIG. 3 may be included in the peripheral circuit structure shown in FIG. 2A, or be included in the peripheral circuit structure shown in FIG. 2B.

Referring to FIG. 3, the peripheral circuit structure PC may include a peripheral gate electrodes PG, a peripheral gate insulating layer PGI, junctions Jn, peripheral circuit lines PCL, and peripheral contact plugs PCP.

The peripheral gate electrodes PG may be used as gate electrodes of NMOS and PMOS transistors in the peripheral circuit structure PC. The peripheral gate insulating layer PGI is disposed between each of the peripheral gate electrodes PG and a substrate SUB.

Each of the junctions Jn is a region defined by injecting an n-type or p-type impurity into an active region of the substrate SUB, and is disposed both sides of each of the peripheral gate electrodes PG to be used as a source junction or drain junction. The active region of the substrate SUB may be partitioned by an isolation layer ISO formed in the substrate SUB. The isolation layer ISO is formed of an insulating material.

The peripheral circuit lines PCL may be electrically connected to a circuit of the peripheral circuit structure PC through the peripheral contact plugs PCP.

A peripheral circuit insulating layer PIL may cover the circuit of the peripheral circuit structure PC, the peripheral circuit lines PCL, and the peripheral contact plugs PCP. The peripheral circuit insulating layer PIL may include insulating layers stacked in a multi-layer.

FIGS. 4A to 4E are perspective views schematically illustrating semiconductor devices according to embodiments. For convenience of description, interlayer insulating layers are not illustrated in FIGS. 4A to 4E.

Referring to FIGS. 4A to 4E, each of the semiconductor devices may include a memory string CST having a three-dimensional structure. The memory string CST having the three-dimensional structure may improve the degree of integration of the semiconductor device. The memory string CST may include memory cells and select transistors, which are arranged along each of channel structures CH.

Each of the channel structures CH may be electrically connected to a bit line BL corresponding thereto. The bit line BL may extend in a second direction II on a horizontal plane intersecting a first direction I. In an embodiment, as shown in FIGS. 4A to 4D, the bit line BL may be in direct contact with a channel structure CH corresponding thereto. In an embodiment, as shown in FIG. 4E, the bit line BL may be connected to a channel structure CH corresponding thereto via a contact plug DCT. The contact plug DCT may extend toward the channel structure CH corresponding thereto while being in contact with the bit line BL.

Gates of the memory cells and gates of the select transistors may be connected to conductive patterns CP1 to CPn stacked in the first direction I to be spaced apart from each other. The conductive patterns CP1 to CPn may be used as word lines WL, source select lines SSL, and drain select lines DSL. The conductive patterns CP1 to CPn may be sequentially arranged in the first direction I, and be disposed in first to nth layers spaced apart from each other. The first layer is defined as a layer disposed most distant from the bit line BL, and the nth layer is defined as a layer disposed closest to the bit line BL. Each of the conductive patterns CP1 to CPn may extend in a horizontal direction.

Referring to FIGS. 4A to 4D, nth patterns CPn disposed in at least the nth layer among the conductive patterns CP1 to CPn may be used as the drain select lines DSL. However, the present disclosure is not limited thereto, and conductive patterns disposed in two or more layers may be used as the drain select lines DSL. In an embodiment, the nth patterns CPn disposed in the nth layer and (n−1)th patterns CPn−1 disposed in an (n−1)th layer may be used as the drain select lines DSL.

First patterns CP1 disposed in at least the first layer may be used as the source select lines SSL. However, the present disclosure is not limited thereto, and conductive patterns disposed in two or more layers may be used as the source select lines SSL. In an embodiment, the first patterns CP1 disposed in the first layer and second patterns CP2 disposed in a second layer may be used as the source select lines SSL.

Conductive patterns (e.g., CP3 to CPn−2) disposed between the drain select lines DSL and the source select lines SSL may be used as the word lines WL.

The conductive patterns CP1 to CPn may be separated from each other by a first slit SI1 in each layer. The patterns used as the drain select lines DSL among the conductive patterns CP1 to CPn may be separated from each other by not only the first slit SI1 but also a second slit SI2 in each layer. However, the present disclosure is not limited thereto. Although not shown in the drawings, in an embodiment, the patterns used as the source select lines SSL among the conductive patterns CP1 to CPn may be separated from each other by not only the first slit SU but also a third slit in each layer. Although not shown in the drawings, in an embodiment, the second slit SI2 may be omitted, and the patterns used as the drain select lines DSL may be separated from each other by the first slit SU in each layer. The second slit SI2 and the third slit, which are described above, may overlap with each of the word lines WL separated by the first slit SI1, and be formed to a depth where the second slit SI2 and the third slit do not penetrate the word lines WL.

The first slit SI1 and the second slit SI2 may extend along a third direction III on a horizontal plane. The third direction III is defined as a direction intersecting the first direction I and the second direction II. Channel structures CH shared by each of the word lines WL may be separated into groups controlled by different drain select lines DSL. In an embodiment, the drain select lines DSL may include a first drain select line and a second drain select line, which are separated from each other by the second slit SI2. The channel structures CH shared by each of the word lines WL may be divided into a first group controlled by the first drain select line and a second group controlled by the second drain select line.

Each of the word lines WL, the drain select lines DSL, and the source select lines SSL may commonly surround channel structures CH of one column or more. The channel structures CH surrounded by each of the word lines WL, the drain select lines DSL, and the source select lines SSL may be disposed in zigzag.

The first slit SI1 may be disposed at a boundary between the memory blocks. Drain select lines DSL disposed in the same layer in each of the memory blocks may be separated from each other by the second slit SI2. Each of the word lines WL is not separated by the second slit SI2, but may extend to overlap with the second slit SI2. Although not shown in the drawings, source select lines SSL disposed in the same layer in each of the memory blocks may be separated from each other by the third slit. Each of the word lines is not separated by the third slit, but may extend to overlap with the third slit.

Figure 4A:
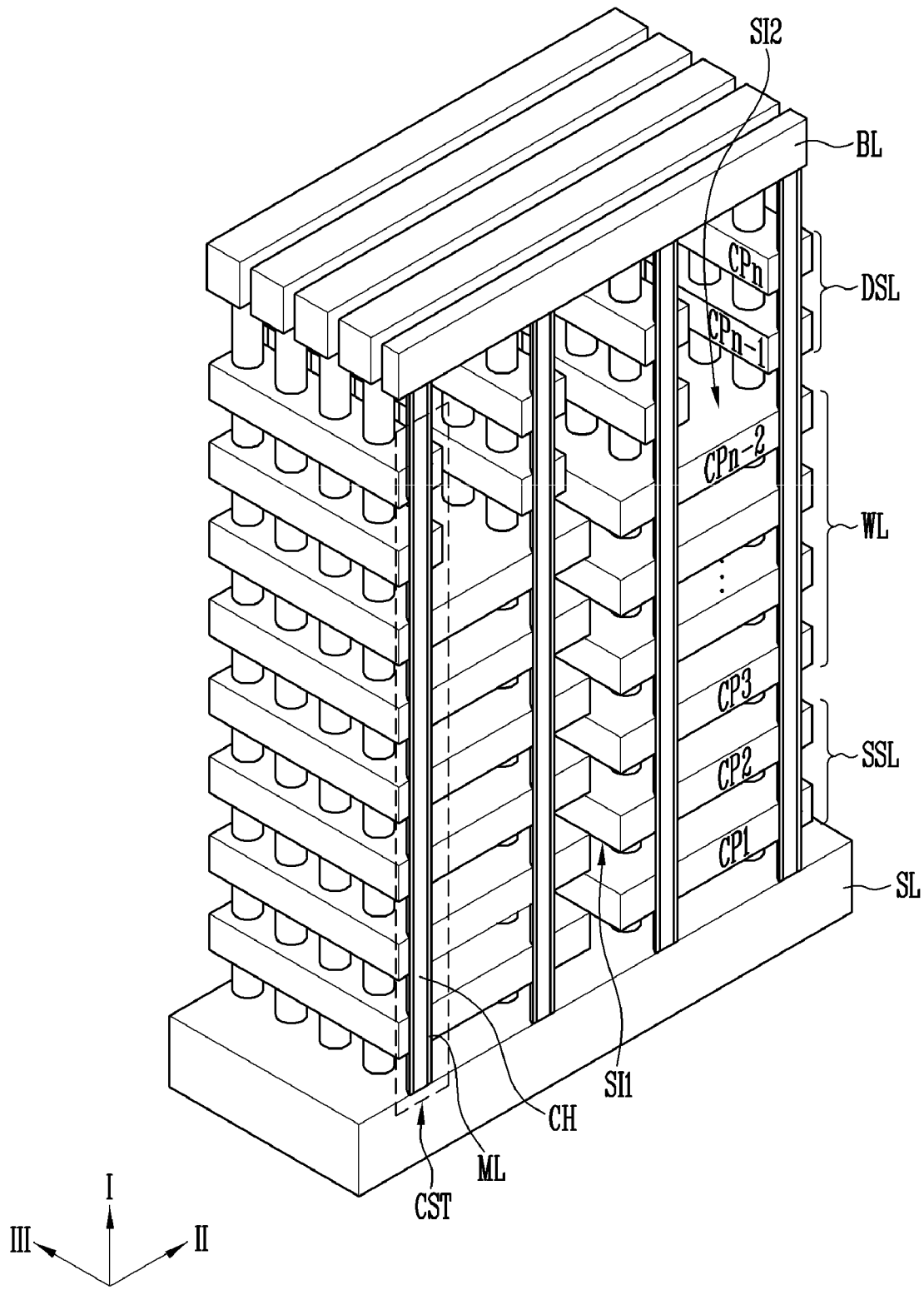
FIGS. 4A to 4E are perspective views schematically illustrating semiconductor devices according to embodiments.
Figure 4B:
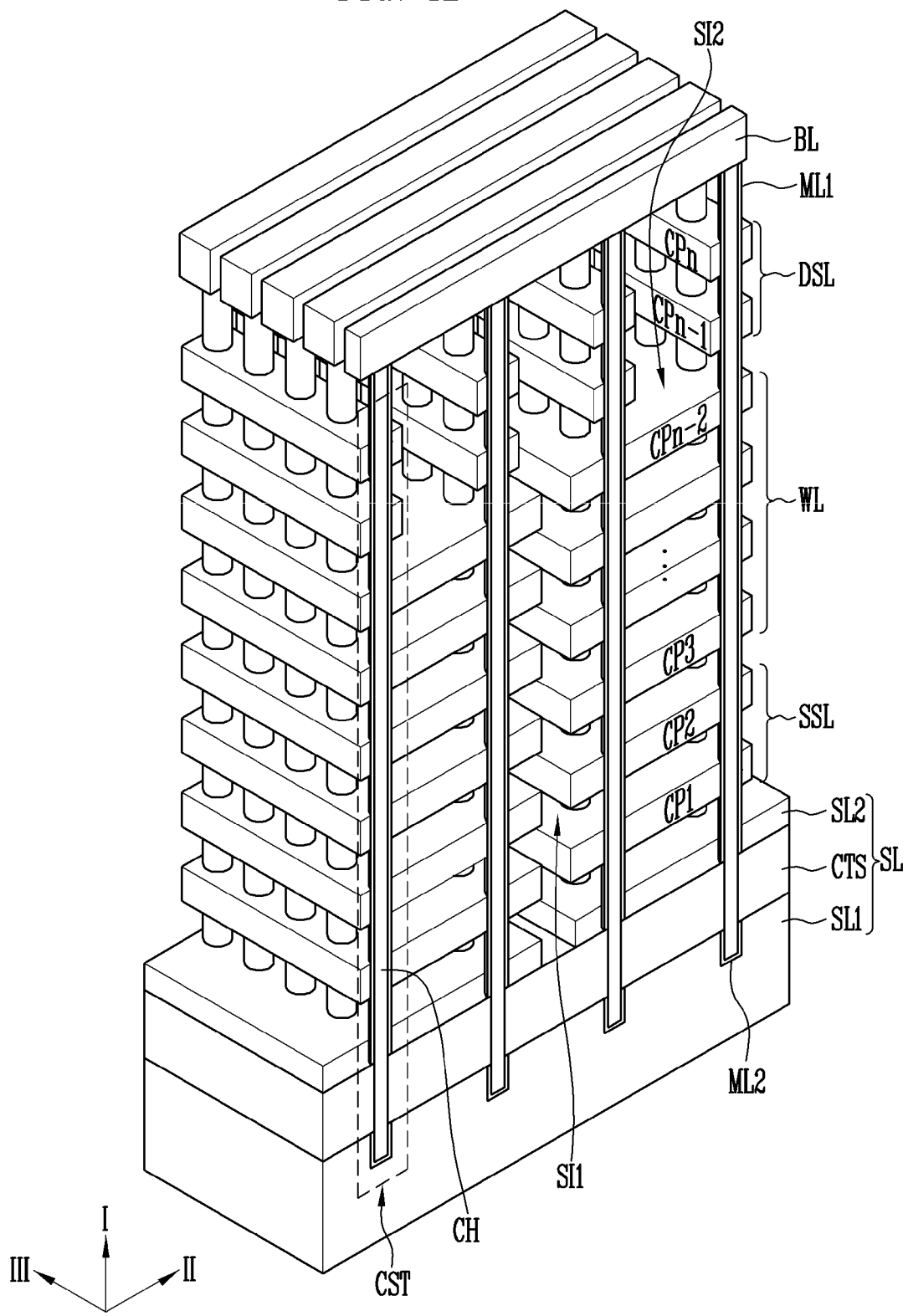
Figure 4C:
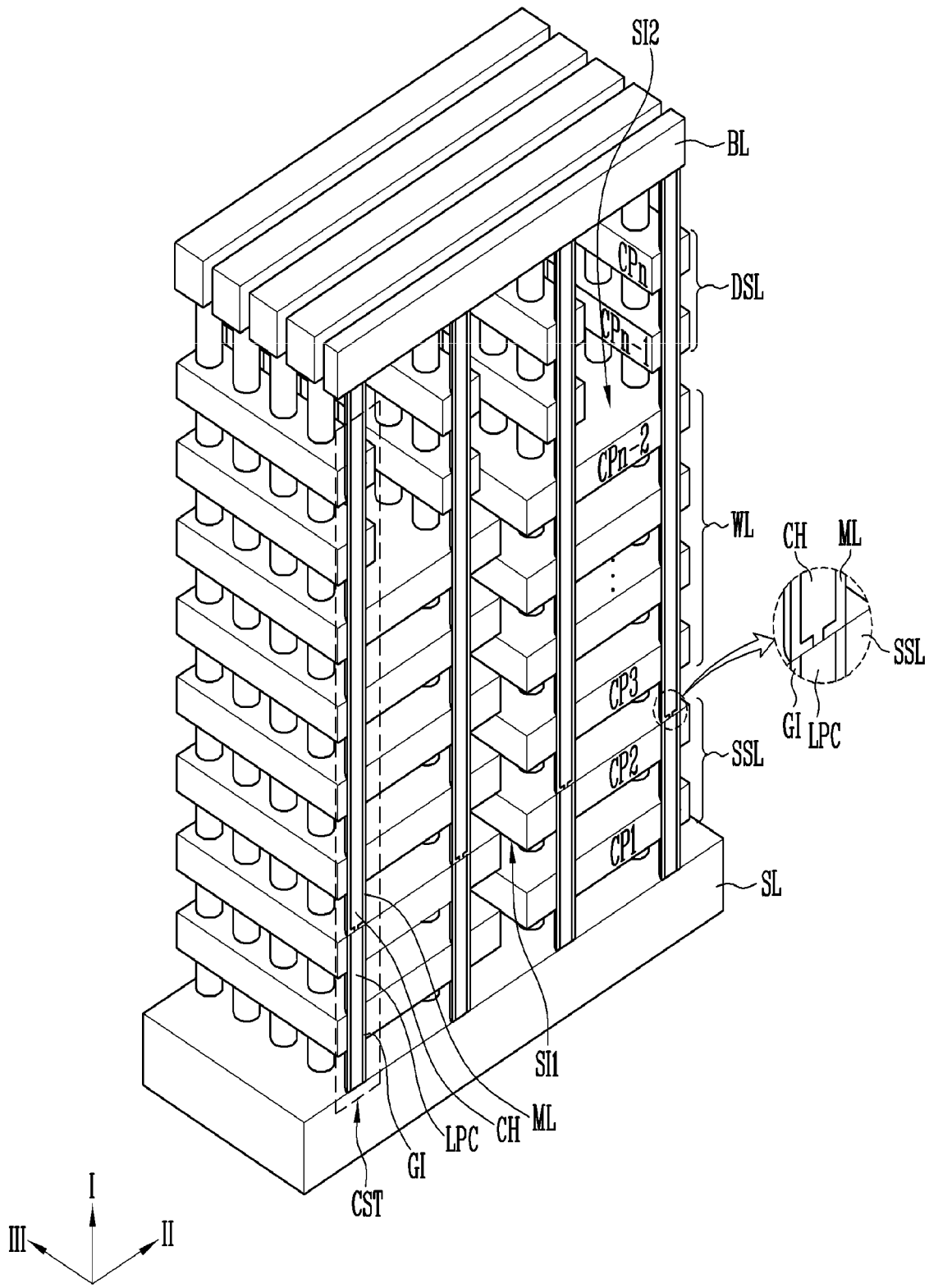
Figure 4D:
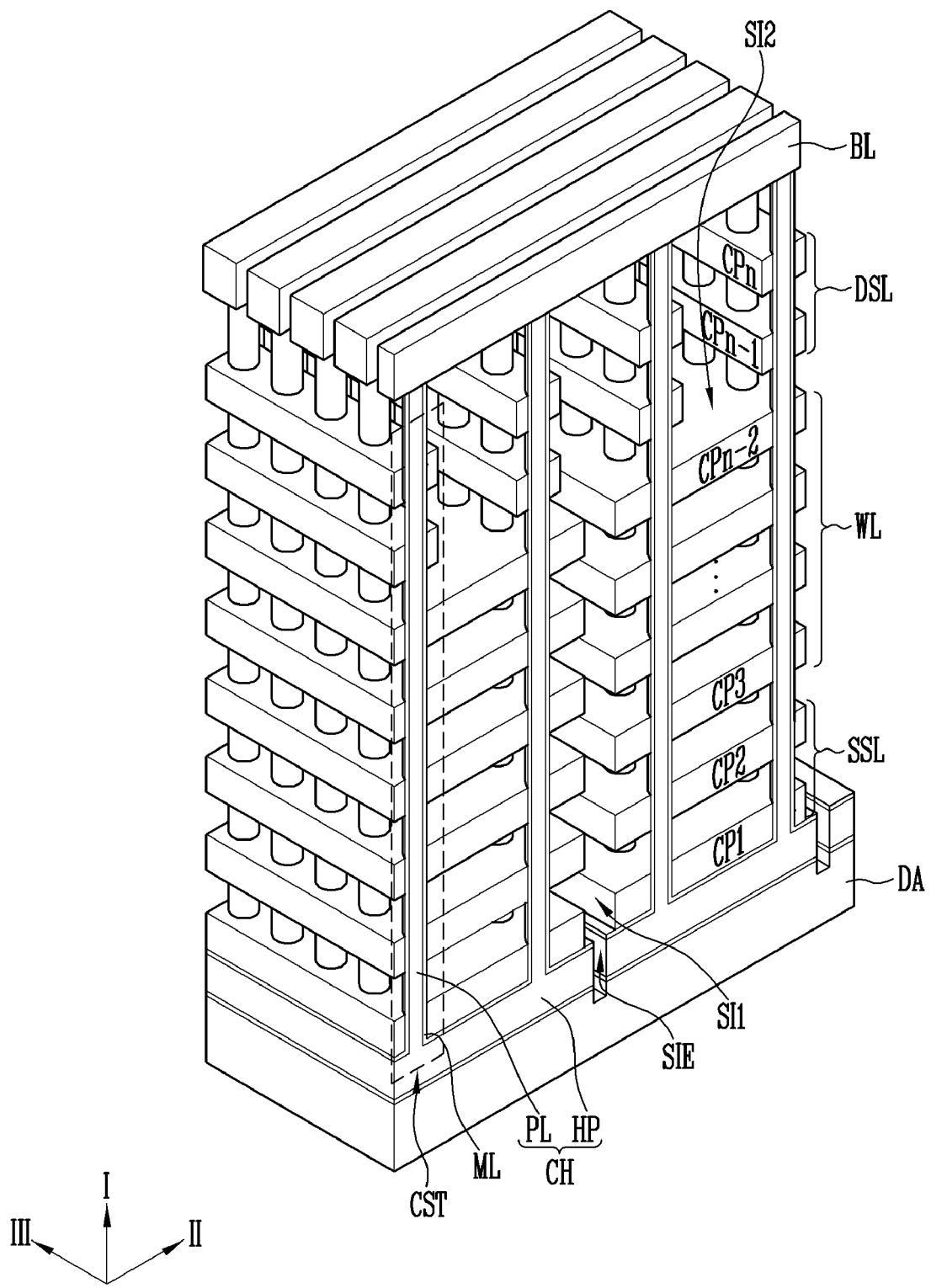
Figure 4E:
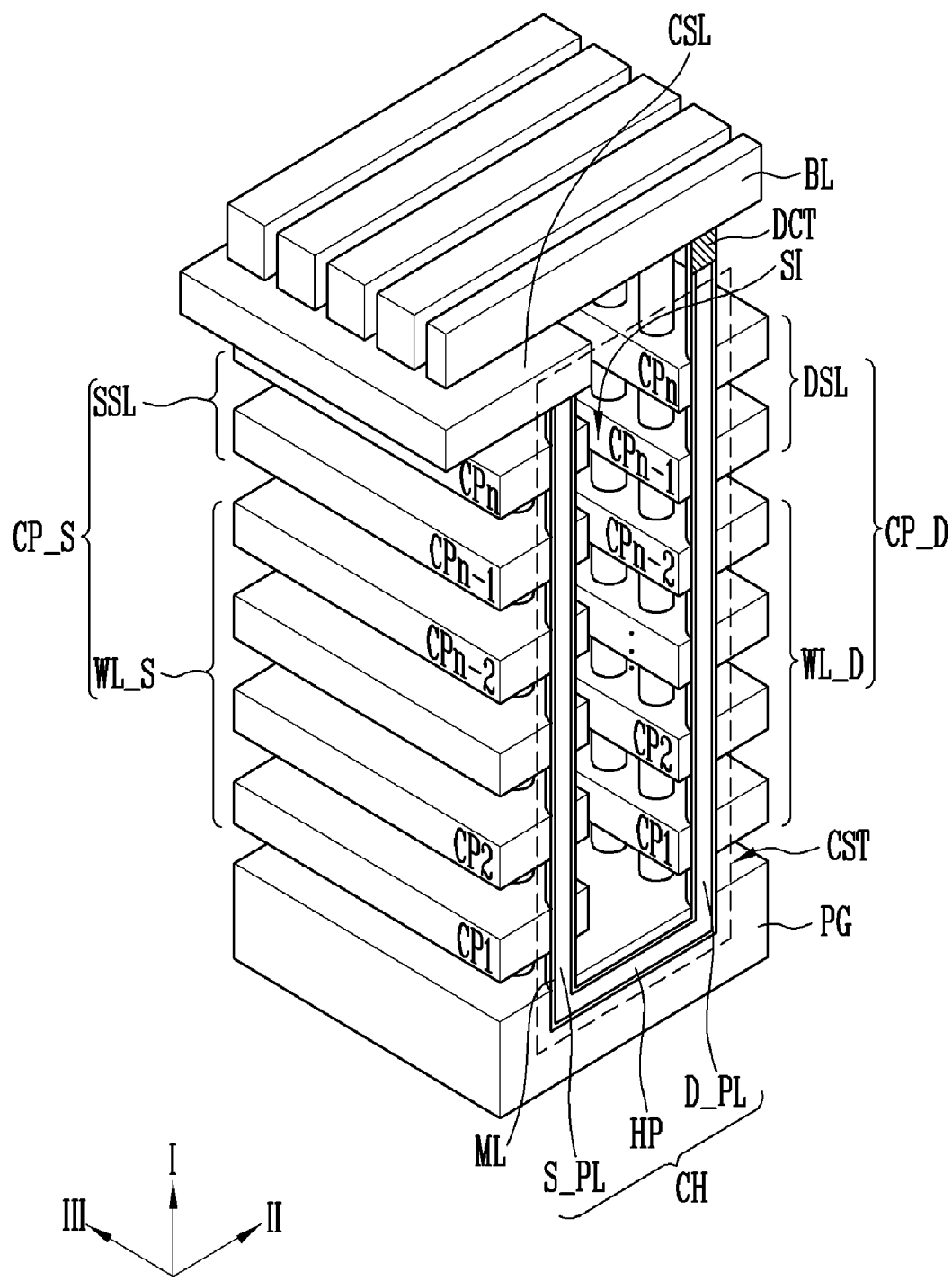

Referring to FIGS. 4A, 4B, and 4D, each of the channel structures CH may penetrate the drain select lines DSL, the word lines WL, and the source select lines SSL. Referring to FIG. 4C, each of the channel structures CH may penetrate the drain select lines DSL and the word lines WL.

Referring to FIGS. 4A and 4B, the channel structures CH may be directly connected to a source layer SL disposed under the conductive patterns CP1 to CPn. The source layer SL may be formed in various structures.

Referring to FIG. 4A, the source layer SL may be in contact with a bottom surface of each of the channel structures CH. The source layer SL may be formed of a doped semiconductor layer including a source dopant. The source dopant may include an n-type impurity. In an embodiment, the source layer SL may be formed by injecting the source dopant into the substrate SUB described with reference to FIG. 2A from a surface of the substrate SUB. In an embodiment, the source layer SL may be formed by depositing the doped semiconductor layer on the substrate SUB described with reference to FIG. 2B. An insulating layer may be disposed between the substrate SUB and the doped semiconductor layer. In an embodiment, the doped semiconductor layer may be a doped silicon layer.

Each of the channel structures CH may be in contact with a top surface of the source layer SL, penetrate the conductive patterns CP1 to CPn, and extend along the first direction I toward the bit line BL from the source layer SL. A sidewall of each of the channel structures CH may be surrounded by a multi-layer ML. The multi-layer ML may extend along the sidewall of a channel structure CH corresponding thereto. Top and bottom surfaces of each of the channel structures CH are not blocked by the corresponding multi-layer ML, but may be opened. In an embodiment, top and bottom surfaces of each of the channel structures CH are not blocked by the corresponding multi-layer ML, and these surfaces may be left without the formation of the multi-layer ML on them.

Referring to FIG. 4B, the channel structures CH may penetrate the conductive patterns CP1 to CPn and extend to the inside of the source layer SL. The sidewall of each of the channel structures CH may in contact with the source layer SL.

The source layer SL may include a first source layer SL1 and a contact source layer CTS. The source layer SL may further include a second source layer SL2. The channel structures CH may penetrate the second source layer SL2 and the contact source layer CTS, and extend to the inside of the first source layer SL1.

The first source layer SL1 may be formed of a doped semiconductor layer including a source dopant. The source dopant may include an n-type impurity. In an embodiment, the first source layer SL1 may be formed by injecting the source dopant with a partial thickness from the surface of the substrate SUB described with reference to FIG. 2A. In an embodiment, the first source layer SL1 may be formed by depositing the doped semiconductor layer on the substrate SUB described with reference to FIG. 2B. An insulating layer may be disposed between the substrate SUB and the doped semiconductor layer. In an embodiment, the doped semiconductor layer may be a doped silicon layer. The first source layer SL1 may surround a lower end of each of the channel structures CH.

The contact source layer CTS may be disposed on the first source layer SL1, and be in contact with a top surface of the first source layer SL1. The contact source layer CTS is in contact with the sidewall of each of the channel structures CH, and surrounds the channel structures CH.

A multi-layer extending along the sidewall of each of the channel structures CH is separated into a first multi-layer pattern ML1 and a second multi-layer pattern ML2 by the contact source layer CTS. The first multi-layer pattern ML1 is defined as a pattern surrounding an upper end of each of the channel structures CH, and the second multi-layer pattern ML2 is defined as a pattern disposed between the first source layer SL1 and each of the channel structures CH.

The second source layer SL2 may be disposed between the contact source layer CTS and the source select line SSL. The second source layer SL2 may be formed to surround the first multi-layer pattern ML1. The second source layer SL2 may be omitted in some cases. The second source layer SL2 may be penetrated by the first slit SI1.

Each of the contact source layer CTS and the second source layer SL2, which are described above, may be formed of a doped semiconductor layer including a source dopant. The source dopant may include an n-type impurity. In an embodiment, the doped semiconductor layer may include a doped silicon layer.

Referring to FIG. 4C, each of the channel structures CH may be connected to a lower channel structure LPC corresponding thereto.

The lower channel structure LPC is connected to a channel structure CH corresponding thereto under the channel structure CH. Each of the channel structures CH may be surrounded by a multi-layer ML. The multi-layer ML may extend along the sidewall of a channel structure CH corresponding thereto. The top and bottom surfaces of the channel structure CH are not blocked by the multi-layer ML, but may be opened. In an embodiment, top and bottom surfaces of each of the channel structures CH are not blocked by the corresponding multi-layer ML, and these surfaces may be left without the formation of the multi-layer ML on them.

The lower channel structure LPC penetrates at least one source select line SSL disposed under the word lines WL. A sidewall of the lower channel structure LPC may be surrounded by a gate insulating layer GI. The gate insulating layer GI may extend along the sidewall of the lower channel structure LPC. Top and bottom surfaces of the lower channel structure LPC are not blocked by the gate insulating layer GI, but may be opened. In an embodiment, the top and bottom surfaces of the lower channel structure LPC are not blocked by the gate insulating layer GI, and these surfaces may be left without the formation of the gate insulating layer GI on them.

A source layer SL may be in contact with the bottom surface of the lower channel structure LPC. The source layer SL may be formed of the same material as the source layer SL described with reference to FIG. 4A.

Referring to FIG. 4D, each of the channel structures CH may include pillar parts PL penetrating the conductive patterns CP1 to CPn and a horizontal part HP extending in a horizontal direction from the pillar parts PL. The horizontal parts HP of the channel structures CH may extend along lower surfaces of the first patterns CP1. The horizontal parts HP may be separated from each other by a slit extending part SIE extending from the first slit SI1. A doped region DA may be disposed under the horizontal parts HP. In other words, the horizontal parts HP may be disposed between the doped region DA and the first patterns CP1.

In an embodiment, the doped region DA may be formed of a doped semiconductor layer including a well dopant. The well dopant may include a p-type impurity. In an embodiment, the doped region DA may be formed by injecting the well dopant into the substrate SUB described with reference to FIG. 2A from the surface of the substrate SUB. In an embodiment, the doped region DA may be formed by depositing the doped semiconductor layer on the substrate SUB described with reference to FIG. 2B. An insulating layer may be disposed between the substrate SUB and the doped semiconductor layer. In an embodiment, the doped semiconductor layer may be a doped silicon layer.

A sidewall of each of the pillar parts PL may be surrounded by a multi-layer ML. The multi-layer ML may extend between a horizontal part HP corresponding thereto and the first pattern CP1 corresponding thereto. The multi-layer ML may extend between the horizontal part HP corresponding thereto and the doped region DA.

Referring to FIG. 4E, the conductive patterns CP1 to CPn may be divided into source-side conductive patterns CP_S and drain-side conductive patterns CP_D by a slit SI.

A source-side nth pattern CPn disposed in at least an nth layer among the source-side conductive patterns CP_S may be used as the source select line SSL. However, the present disclosure is not limited thereto, and each of conductive patterns disposed in two or more layers may be used as the source select line SSL. In an embodiment, each of the source-side nth pattern CPn and a source-side (n−1)th pattern CPn−1, which are respectively disposed in the nth layer and the (n−1)th layer, among the source-side conductive patterns CP_S may be used as the source select line SSL. Conductive patterns (e.g., CP1 to CPn−2) disposed under the source select line SSL among the source-side conductive patterns CP_S may be used as source-side word lines WL_S.

A drain-side nth pattern CPn disposed in at least an nth layer among the drain-side conductive patterns CP_D may be used as the drain select line DSL. However, the present disclosure is not limited thereto, and each of conductive patterns disposed in two or more layers may be used as the drain select line DSL. In an embodiment, each of the drain-side nth pattern CPn and a drain-side (n−1)th pattern CPn−1, which are respectively disposed in the nth layer and an (n−1)th layer, among the drain-side conductive patterns CP_D may be used as the drain select line DSL. Conductive patterns (e.g., CP1 to CPn−2) disposed under the drain select line DSL among the drain-side conductive patterns CP_D may be used as drain-side word lines WL_D.

A common source line CSL may be disposed above the source-side conductive patterns CP_S. The common source line CSL is disposed in a layer different from that of the bit line BL. The common source line CSL and the bit line BL are formed of a conductive material, and are spaced apart from each other. For example, the common source line CSL may be disposed between the bit line BL and the source-side conductive patterns CP_S.

Each of the channel structures CH may include a source-side pillar S_PL, a drain-side pillar D_PL, and a horizontal part HP. The drain-side pillar D_PL may be electrically connected to the bit line BL. The drain-side pillar D_PL extends to penetrate the drain-side conductive patterns CPD, and is connected to the horizontal part HP. The source-side pillar S_PL may be electrically connected to the common source line CSL. The source-side pillar S_PL extends to penetrate the source-side conductive patterns CP_S, and is connected to the horizontal part HP. The horizontal part HP is buried in a pipe gate PG. The source-side pillar S_PL and the drain-side pillar D_PL extend in the first direction I from the horizontal part HP. The pipe gate PG may be disposed under the source-side conductive patterns CP_S and the drain-side conductive patterns CP_D, and be formed to surround the horizontal part HP. The pipe gate PG may be used as a gate of a pipe transistor. The pipe transistor may electrically connect the source-side pillar S_PL and the drain-side pillar D_PL through the horizontal part HP according to a signal transmitted to the pipe gate PG.

An outer wall of each of the channel structures CH may be surrounded by a multi-layer ML. The multi-layer ML extends along a sidewall of the drain-side pillar D_PL, an outer wall of the horizontal part HP, and a sidewall of the source-side pillar S_PL of a channel structure CH corresponding thereto.

The slit SI may be disposed between the source-side conductive patterns CP_S and the drain-side conductive patterns CP_D, which are adjacent to each other in the second direction II, and extend along the third direction III.

The word lines WL, WL_D or WL_S described with reference to FIGS. 4A to 4D are used as the gates of the memory cells, the drain select line DSL described with reference to FIGS. 4A to 4D is used as a gate of a drain select transistor, and the source select line SSL described with reference to FIGS. 4A to 4D is used as a gate of a source select transistor. The multi-layer ML or ML1 disposed between each of the word lines WL, WL_D or WL_S and each channel structure CH may include a data storage layer for storing data.

A gate stack structure including the word lines WL, WL_D or WL_S, the drain select line DSL, and the source select line SSL, which are described with reference to FIGS. 4A to 4E, may be formed using various manufacturing methods. In an embodiment of the present disclosure, the gate stack structure may be formed using the replace process described with reference to FIGS. 1A to 1E, so that the manufacturing time of the semiconductor device can be reduced.

Figure 5:
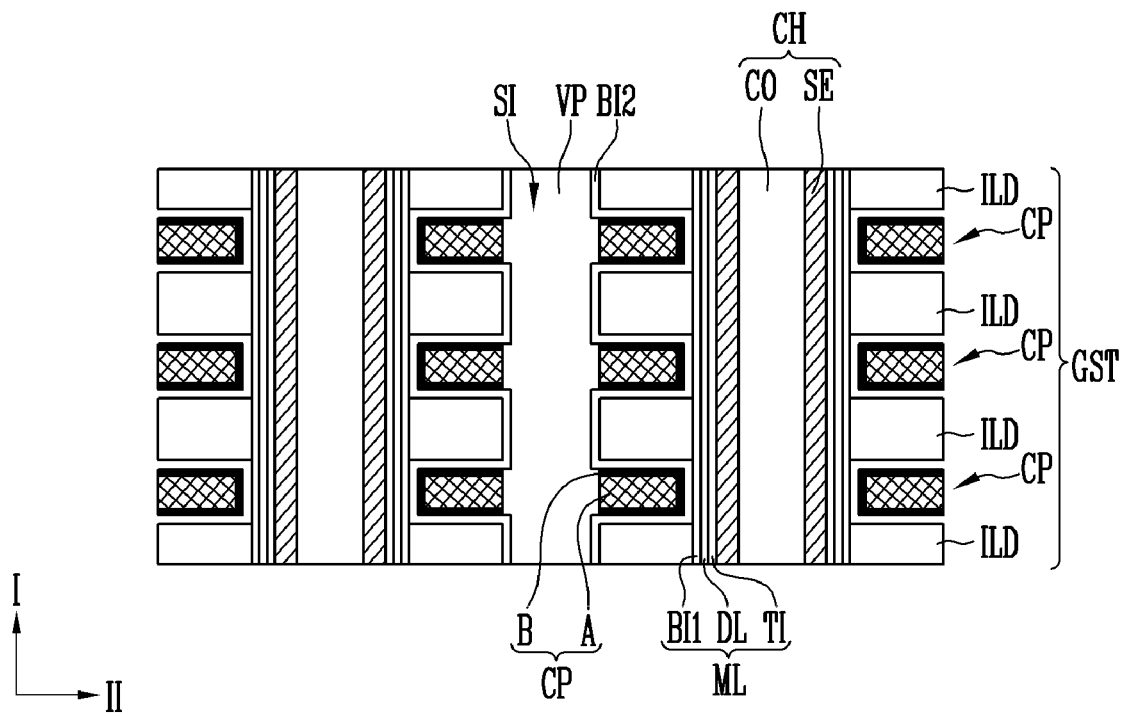
FIG. 5 is a sectional view illustrating gate stack structures of a semiconductor device according to an embodiment.

FIG. 5 is a sectional view illustrating gate stack structures of a semiconductor device according to an embodiment. FIG. 5 may correspond to an enlarged sectional view illustrating gate stack structures including conductive patterns, which are shown in each of FIGS. 4A to 4E.

Referring to FIG. 5, the gate stack structures GST may be separated from each other by a slit SI. Each of the gate stack structures GST may include interlayer insulating layers ILD and conductive patterns CP, which are alternately stacked in a first direction I. The conductive patterns CP may correspond to the conductive patterns CP1 to CPn shown in any one of FIGS. 4A to 4E. Each of the conductive patterns CP is disposed between interlayer insulating layers ILD adjacent to each other in the first direction I.

Each of the conductive patterns CP may be formed of various conductive materials. Each of the conductive patterns CP may include at least one of a silicon layer, a metal silicide layer, a metal layer, and a metal nitride layer. In an embodiment, each of the conductive patterns CP may include a metal layer A such as tungsten W to achieve low-resistance wiring. When each of the conductive patterns CP includes the metal layer A, each of the conductive patterns CP may further include a barrier layer B.

The barrier layer B may block a metal from being diffused to the outside from the metal layer A. The barrier layer B may surround the metal layer A. The barrier layer B may have a substantially C-shaped cross sectional that is opened toward the slit SI. The barrier layer B may extend between a channel structure CH and the metal layer A and between the metal layer A and each of the interlayer insulating layers ILD. The barrier layer B may be formed of a metal nitride layer. For example, the barrier layer B may include a titanium nitride layer, a tungsten nitride layer or a tantalum nitride layer.

The interlayer insulating layers ILD may be formed of various insulating materials. For example, the interlayer insulating layers ILD may be formed of a silicon oxide layer.

The channel structure CH penetrating each of the gate stack structure GST is surrounded by the interlayer insulating layer ILD and the conductive patterns CP. A multi-layer ML may be disposed between the channel structure CH and each of the conductive patterns CP. The multi-layer ML may correspond to the multi-layer ML shown in each of FIGS. 4A, 4C, and 4D, or correspond to the first multi-layer pattern ML1 shown in FIG. 4B.

The multi-layer ML may extend along a sidewall of the channel structure CH. However, the present disclosure is not limited thereto. Although not shown in the drawing, in an embodiment, the multi-layer ML may extend along interfaces between the conductive patterns CP and the interlayer insulating layers ILD and interfaces between the channel structure CH and the conductive patterns CP. The barrier layer B may extend between the metal layer A corresponding thereto and the multi-layer ML.

The channel structure CH may include a semiconductor layer SE. In an embodiment, the semiconductor layer SE may be formed of a silicon layer. The semiconductor layer SE may be conformally formed on an inner wall of the multi-layer ML, or be formed to completely fill a central region of the multi-layer ML.

As shown in FIG. 5, when the semiconductor layer SE is conformally formed on the inner wall of the multi-layer ML, the channel structure CH may further include a core insulating layer CO filling a central region of the semiconductor layer SE.

The multi-layer ML may include a tunnel insulating layer TI surrounding the channel structure CH, a data storage layer DL surrounding the tunnel insulating layer TI, and a first blocking insulating layer BI1 surrounding the data storage layer DL.

The data storage layer DL may be formed of a charge trapping layer, be formed of a material layer including conductive nano dots, or be formed of a phase change material layer.

The data storage layer DL may store data changed using Fowler-Nordheim tunneling caused by a difference in voltage between patterns used as word lines among the conductive patterns CP and the channel structure CH. The data storage layer DL may be formed of a silicon nitride layer in which charges can be trapped.

The data storage layer DL may store data, based on another operating principle instead of the Fowler-Nordheim tunneling. For example, the data storage layer DL may be formed of a phase change material layer, and store data according to a phase change.

The first blocking insulating layer BI1 may include an oxide layer capable of blocking charges. The tunnel insulating layer TI may be formed of a silicon oxide layer through which charges can tunnel. A second blocking insulating layer BI2 may be further formed along interfaces between the conductive patterns CP and the interlayer insulating layer ILD. The second blocking insulating layer BI2 may extend onto a sidewall of each of the interlayer insulating layers ILD, which faces the slit SI. The second blocking insulating layer BI2 may be formed of an insulating material having a high dielectric constant. For example, the second blocking insulating layer BI2 may be formed of an aluminum oxide layer. Any one of the first blocking insulating layer BI1 and the second blocking insulating layer BI2 may be omitted.

The slit SI may correspond to the first slit SU shown in each of FIGS. 4A to 4D, or correspond to the slit SI shown in FIG. 4E. The slit SI may be filled with a vertical structure VP. In an embodiment, the vertical structure VP may be formed to fill the slit SI with an insulating material. In an embodiment, the vertical structure VP may include a conductive material and a sidewall insulating layer surrounding the conductive material.

FIGS. 6A to 6G are sectional views illustrating a manufacturing method of a semiconductor device according to an embodiment. For example, FIGS. 6A to 6G are sectional views illustrating a manufacturing method of a gate stack structure, using a replacement process.

Figure 6A:
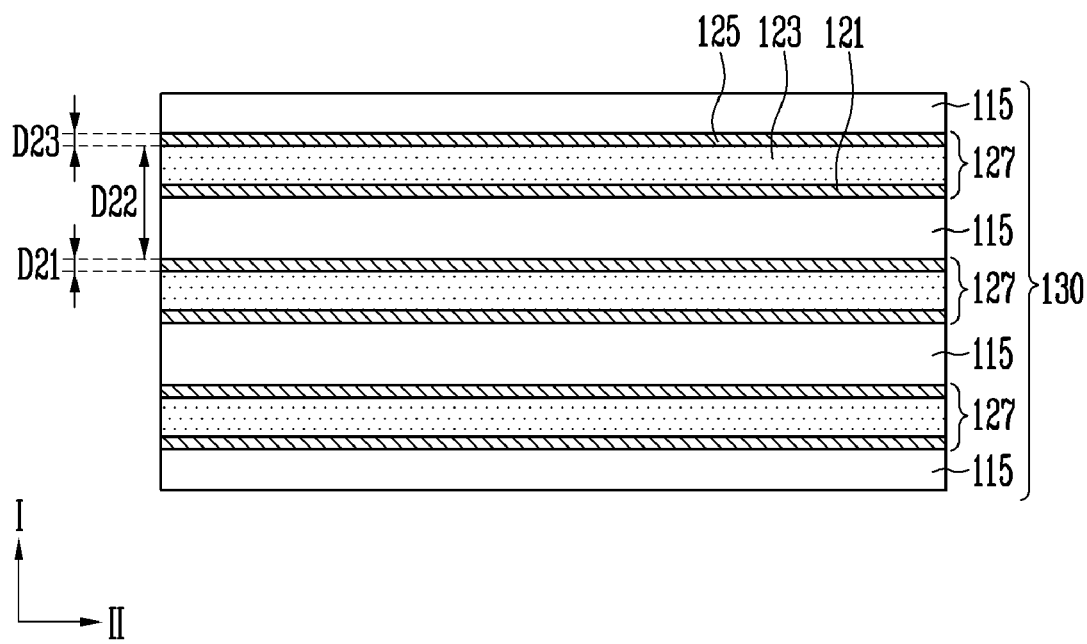
FIGS. 6A to 6G are sectional views illustrating a manufacturing method of a semiconductor device according to an embodiment.

Referring to FIG. 6A, a stack structure 130 is formed by alternately stacking interlayer insulating layers 115 and multi-sacrificial layers 127 in a first direction I.

The interlayer insulating layers 115 are formed of a material different from that of the multi-sacrificial layers 127. The interlayer insulating layers 115 may be formed of an oxide such as a silicon oxide layer. Each of the multi-sacrificial layers 127 may be formed by alternately stacking different materials. In an embodiment, each of the multi-sacrificial layers 127 may include a first material layer 121, a second material layer 123, and a third material layer 125, which are sequentially stacked.

The second material layer 123 may be formed of a material different from those of the first material layer 121 and the third material layer 125, and the third material layer 125 may be formed of the same material as the first material layer 121. For example, the second material layer 123 may be formed of a material having an etch rate different from those of the first material layer 121 and the third material layers 125. Any one of the first material layer 121 and the third material layer 125 may be omitted.

The second material layer 123 may be formed thicker than each of the first material layer 121 and the third material layer 125, which are removed at a relatively high speed in a subsequent process (D22>D21, D23).

Figure 6B:
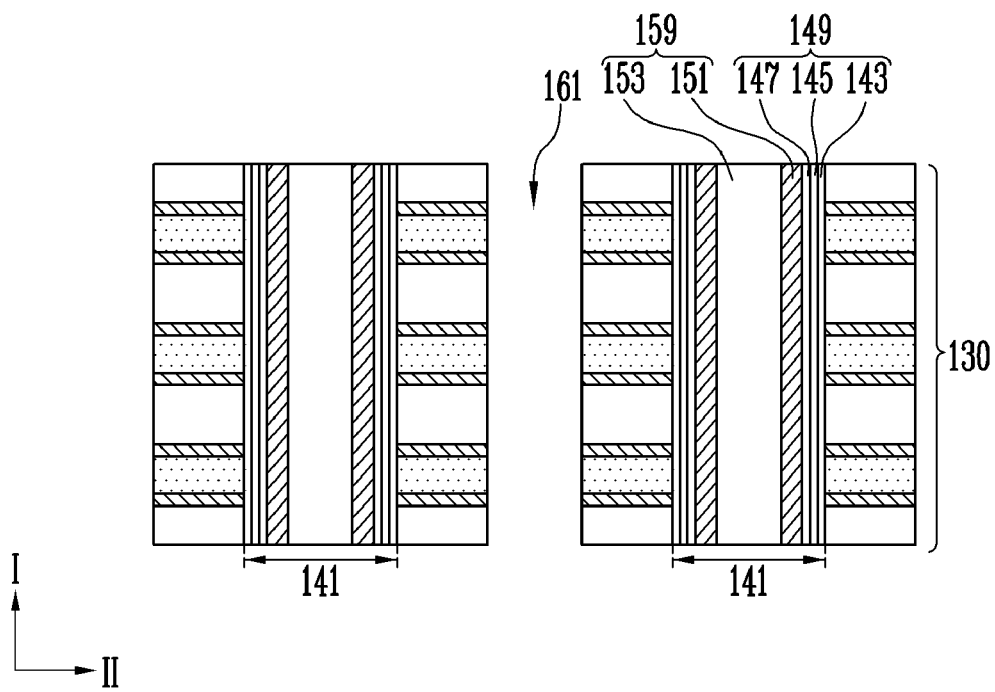

Referring to FIG. 6B, channel structures 159 penetrating the stack structure 130 may be formed. The process of forming the channel structures 159 may include a process of forming holes 141 penetrating structure 130 and a process of filling the holes 141 with the channel structures 159. The process of forming the channel structures 159 may further include a process of, before the channel structures 159 are formed, forming a multi-layer 149 on a sidewall of each of the holes 141. The channel structures 159 may be formed on the multi-layer 149.

The process of forming the multi-layer 149 may include a process of sequentially stacking a first blocking insulating layer 143, a data storage layer 145, and a tunnel insulating layer 147 toward a central region of each of the holes 141 from the sidewall of each of the holes 141. An example of the material of each of the first blocking insulating layer 143, the data storage layer 145, and the tunnel insulating layer 147 is the same as described with reference to FIG. 5.

Each of the channel structures 159 may include a semiconductor layer 151, or include the semiconductor layer 151 and a core insulating layer 153 as described with reference to FIG. 5.

Subsequently, a slit 161 penetrating the stack structure 130 may be formed between the channel structures 159.

Figure 6C:
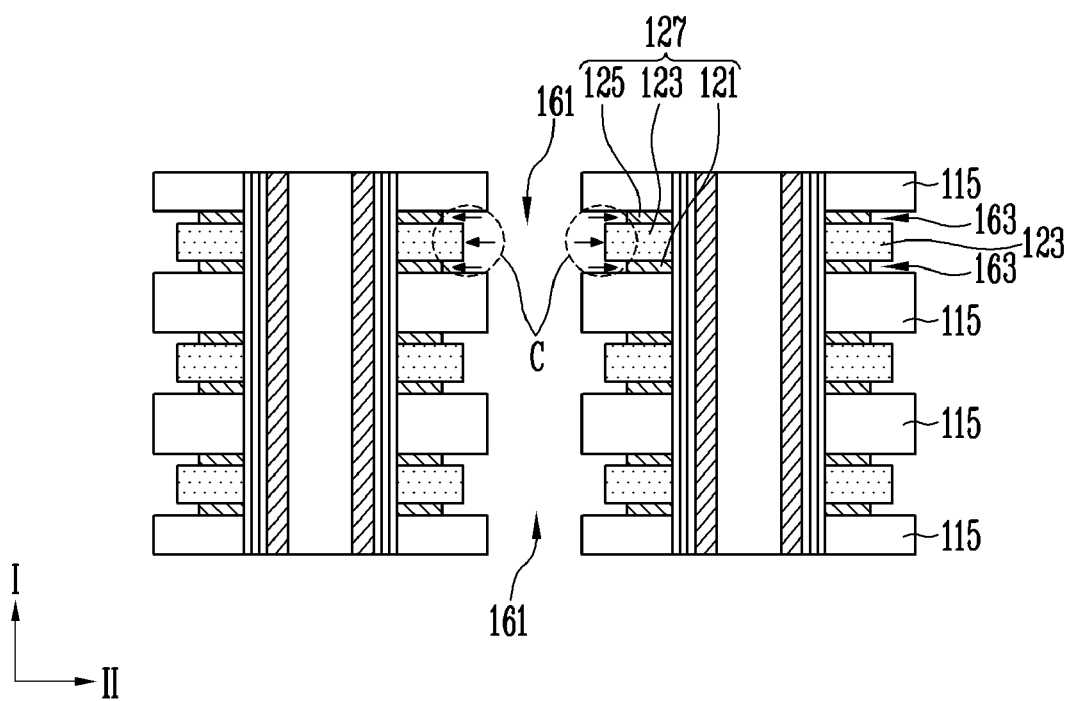

Referring to FIG. 6C, the multi-sacrificial layers 127 may be etched through the slit 161, using an etching material for etching the first and third material layers 121 and 125 more quickly than the second material layer 123. The interlayer insulating layers 115 have a high etching resistance with respect to the etching material, and therefore, the multi-sacrificial layers 127 may be selectively removed during the etching process.

At an early stage of the selective etching process of the multi-sacrificial layers 127, the etching material may be introduced in an arrow direction indicated in region C through the slit 161. The first and third material layers 121 and 125 are etched more quickly than the second material layer 123 due to a difference in etching speed between the first to third material layers 121, 123, and 125. As a result, a gap 163 may be formed between each of the interlayer insulating layers 115 and the second material layer 123.

For example, each of the first material layer 121 and the third material layer 125 may include at least one of a Boron Phosphorus Silicate Glass (BPSG), an Undoped Silicate Glass (USG), a Phosphorus Silicate Glass (PSG), and a porous nitride layer, and the second material layer 123 may include a silicon nitride layer. The etching material may be phosphoric acid ($H_2PO_4$). Each of the BPSG, the USG, and the PSG may be etched by the phosphoric acid more quickly than the silicon nitride layer. Since the porous nitride layer has a density lower than that of the silicon nitride layer, the porous nitride layer is etched by the phosphoric acid more quickly than the silicon nitride layer.

Figure 6D:
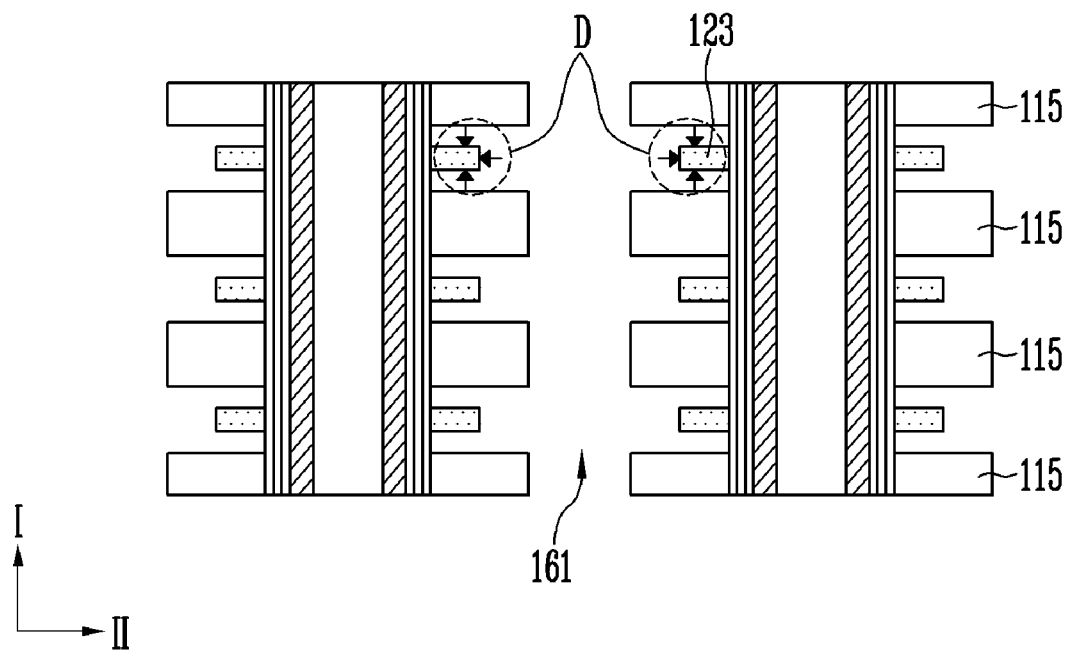

Referring to FIG. 6D, the etching material may be introduced through the gap 163 shown in FIG. 6C. Accordingly, during the process of selectively etching the multi-sacrificial layers 127, the second material layer 123 may be etched in an arrow direction indicated in region D. According to an embodiment of the present disclosure, the surface area of the second material layer 123 exposed to the etching material can be enlarged through the gap 163 shown in FIG. 6C, and thus the etching speed of the second material layer 123 can be increased.

According to an embodiment of the present disclosure, a space between adjacent interlayer insulating layers 115 in the first direction I can be opened at a high speed, as compared with when a sacrificial layer formed of a single layer between the interlayer insulating layers 115. Accordingly, in an embodiment of the present disclosure, the time required to expose the patterns of the semiconductor device to the etching material can be reduced. As a result, in an embodiment of the present disclosure, the phenomenon that the patterns of the semiconductor device are contaminated by the etching material can be reduced. Thus, in an embodiment of the present disclosure, the reliability of the semiconductor device can be improved.

Figure 6E:
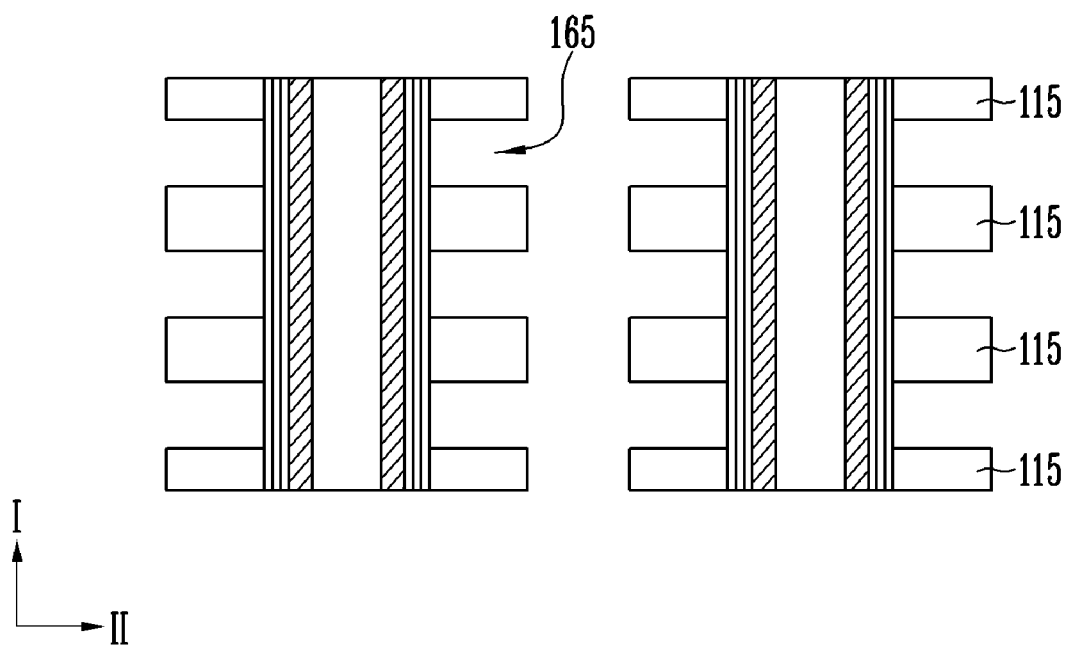

Referring to FIG. 6E, after the multi-sacrificial layers are removed through the selective etching process, interlayer spaces 165 between adjacent interlayer insulating layers 115 in the first direction I may be opened. According to an embodiment of the present disclosure, the time required opening the interlayer spaces 165 between the interlayer insulating layers 115 through the multi-sacrificial layers can be reduced, and thus the manufacturing time of the semiconductor device can be reduced. In some embodiments, opening the interlayer spaces 165 means creating a space between the interlayer insulating layer 115 and the adjacent interlayer insulating layer 115 after etching at least one of the first, second, and third material layers 121, 123, and 125. In other embodiments, opening the interlayer spaces 165 means creating a space between the interlayer insulating layer 115 and the adjacent interlayer insulating layer 115 after etching the multi-sacrificial layer 127 so that a conductive material 179 may be formed between the interlayer insulating layer 115 and the adjacent interlayer insulating layer 115 (See FIG. 6F). In other embodiments, opening the interlayer spaces 165 means removing enough of the multi-sacrificial layer 127 so that an opening may be defined by the adjacent interlayer insulating layers 115 and the multi-layer 149 or channel structures 159. In an embodiment, opening the interlayer spaces 165 means removing the multi-sacrificial film 127 such that at least one surface from a surface of the interlayer insulating layer 115, a surface of the adjacent interlayer insulating layer 115, and a surface of the multi-layer 149 or channel structure 159 is exposed.

Figure 6F:
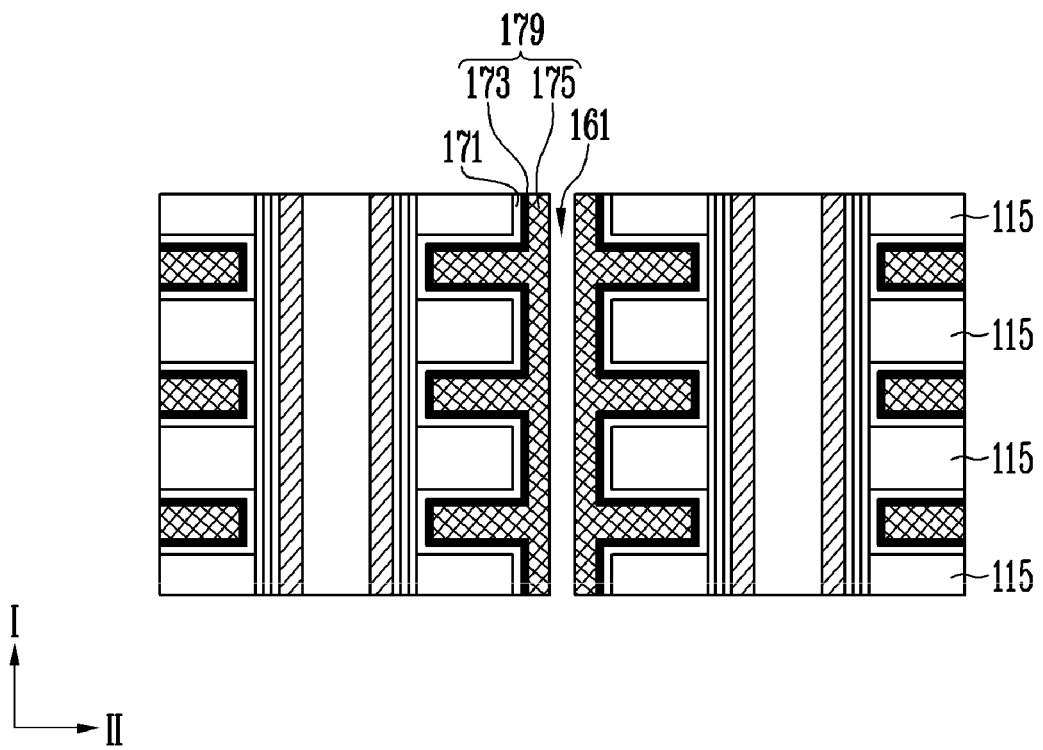

Referring to FIG. 6F, the conductive material 179 fills the interlayer spaces 165 shown in FIG. 6E through the slit 161. Before the interlayer spaces 165 are filled with the conductive material 179, a second blocking insulating layer 171 may be formed on the surfaces defining the interlayer spaces 165. The second blocking insulating layer 171 corresponds to the second blocking insulating layer described with reference to FIG. 5. The second blocking insulating layer 171 may extend to cover each of sidewalls of the interlayer insulating layers 115, which face the slit 161.

The conductive material 179 may include at least one of a silicon layer, a metal silicide layer, a metal layer, and a metal nitride layer. In an embodiment, the conductive material 179 may include a metal layer 175 such as tungsten W to achieve low-resistance wiring. The conductive material 179 may further include a barrier layer 173. The barrier layer 173 may be conformally formed on the surfaces defining each of the interlayer spaces 165 shown in FIG. 6E before the metal layer 175 is formed. The barrier layer 173 may be formed of a metal nitride layer. For example, the barrier layer 173 may include a titanium nitride layer, a tungsten nitride layer or a tantalum nitride layer.

Figure 6G:
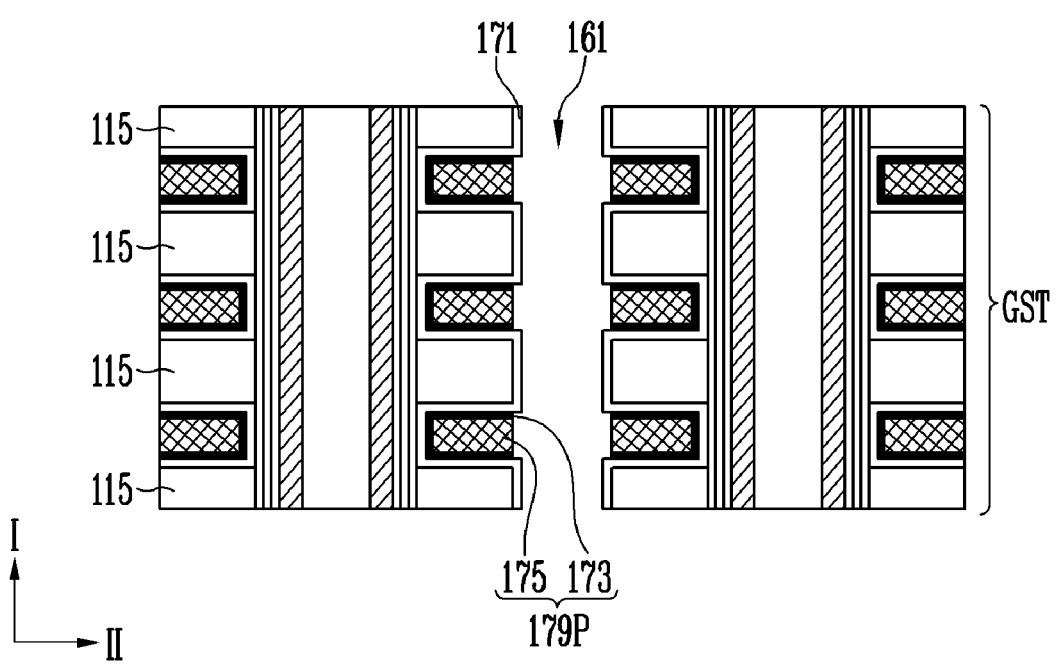

Referring to FIG. 6G, the conductive material 179 is etched to be separated into a plurality of conductive patterns 179P. Accordingly, a gate stack structure GST including the conductive patterns 179P and the interlayer insulating layers 115, which are alternately stacked in the first direction I, can be formed.

Subsequently, the slit 161 may be filled with the vertical structure VP described with reference to FIG. 5.

FIG. 7 is a sectional view illustrating gate stack structures and a source layer of a semiconductor device according to an embodiment. FIG. 7 is an enlarged sectional view illustrating the source layer shown in FIG. 4B and gate stack structures adjacent to the source layer.

Referring to FIG. 7, the gate stack structures GST may be separated from each other by a slit SI1. Each of the gate stack structures GST may be formed in the same structure as described with reference to FIG. 5.

A channel structure CH penetrating each of the gate stack structures GST may extend to the inside of a source layer SL. The source layer SL may include a first source layer SL1 and a contact source layer CTS as described with reference to FIG. 4B. The source layer SL may further include a second source layer SL2.

The channel structure CH is surrounded by a first multi-layer pattern ML1 and a second multi-layer pattern ML2, which are separated from each other by the contact source layer CTS, as described with reference to FIG. 4B. The channel structure CH may include a semiconductor layer SE. In an embodiment, the semiconductor layer SE may be formed of a silicon layer. The semiconductor layer SE may be conformally formed on an inner wall of the first multi-layer pattern ML1, or be formed to fill a central region of a hole defined by the first multi-layer pattern ML1. The semiconductor layer SE extends onto the second multi-layer pattern ML2.

As shown in FIG. 7, when the semiconductor layer SE is conformally formed on the inner wall of the first multi-layer pattern ML1, the channel structure may further include a core insulating layer CO filling a central region of the semiconductor layer SE.

Each of the first multi-layer pattern ML1 and the second multi-layer pattern ML2 may include a tunnel insulating layer TI surrounding the channel structure CH, a data storage layer DL surrounding the tunnel insulating layer TI, and a first blocking insulating layer BI1 surrounding the data storage layer DL.

The tunnel insulating layer TI, the data storage layer DL, and the first blocking insulating layer BI1 are formed of the same materials as described with reference to FIG. 5.

The slit SI1 may correspond to the first slit SI1 shown in FIG. 4B. The slit SI1 may be filled with a vertical structure VP. In an embodiment, the vertical structure VP may include a spacer insulating layer SP covering a sidewall of each of the gate stack structures GST and a conductive vertical contact structure VCT filling the slit SU on the spacer insulating layer SP.

FIGS. 8A to 8F are sectional views illustrating a manufacturing method of a semiconductor device according to an embodiment. For example, FIGS. 8A to 8F are sectional views illustrating a manufacturing method of a source layer, using a replacement process.

Referring to FIG. 8A, a source stack structure STS including a first source layer 201 and a multi-sacrificial layer 217 is formed. A second source layer 221 may be further formed on the multi-sacrificial layer 217. Before the multi-sacrificial layer 217 is formed on the first source layer 201, a first protective layer 203 may be further formed. The multi-sacrificial layer 217 is formed on the first protective layer 203. Before the second source layer 221 is formed, a second protective layer 219 may be further formed on the multi-sacrificial layer 217. The second source layer 221 may be formed on the second protective layer 219. At least one of the first protective layer 203, the second protective layer 219, and the second source layer 221 may be omitted in some cases.

Each of the first source layer 201 and the second source layer 221 may be a doped semiconductor layer including a source dopant. The source dopant may include an n-type impurity. In an embodiment, each of the first source layer 201 and the second source layer 221 may be formed of an n-type doped silicon layer. The first protective layer 203 and the second protective layer 219 may be formed of an oxide layer.

The multi-sacrificial layer 217 may include a first material layer 211, a second material layer 213, and a third material layer 215, which are sequentially stacked.

The second material layer 213 may be formed of a material different from those of the first material layer 211 and the third material layer 215, and the third material layer 215 may be formed of the same material as the first material layer 211. Any one of the first material layer 211 and the third material layer 215 may be omitted. The second material layer 213 may be formed thicker than each of the first material layer 211 and the third material layer 215, which are removed at a relatively high speed in a subsequent process. In an embodiment, the second material layer 213 may be formed to have a greater thickness D32 than the thickness D31 of the first material layer 211. In an embodiment, the second material layer 213 may be formed to have a greater thickness D32 than the thickness D33 of the third material layer 215. In a subsequent process, for example, the first material layer 211 and the third material layer 215 may be removed at a relatively higher speed than the second material layer 213.

Subsequently, gate stack structures GST separated from each other by a slit 261 are formed on the source stack structure STS.

The above-described gate stack structures GST may be formed using the processes described with reference to FIGS. 6A to 6G. In an embodiment, channel structures 259 may extend to the inside of the source stack structure STS while penetrating the gate stack structures GST.

A multi-layer 249 may be formed along an outer wall of each of the channel structures 259. The multi-layer 249 is disposed between a channel structure 259 corresponding thereto and the gate stack structure GST corresponding thereto, and extends between the channel structure 259 corresponding thereto and the source stack structure STS. The channel structure 259 may completely penetrate the first protective layer 203, the multi-sacrificial layer 217, the second protective layer 219, and the second source layer 221. A bottom surface of the channel structure 259 may be disposed in the first source layer 201.

The multi-layer 249 may include a first blocking insulating layer 243, a data storage layer 245, and a tunnel insulating layer 247. The first blocking insulating layer 243, the data storage layer 245, and the tunnel insulating layer 247 may be sequentially stacked toward a surface of the channel structure 259 from a surface of the gate stack structure GST corresponding thereto. The first blocking insulating layer 243, the data storage layer 245, and the tunnel insulating layer 247 may be sequentially stacked toward the surface of the channel structure 259 from the source stack structure STS. Each of the first blocking insulating layer 243, the data storage layer 245, and the tunnel insulating layer 247 may be formed of the same materials as described with reference to FIG. 5.

Each of the channel structures 259 may include a semiconductor layer 251 as described with reference to FIG. 5, or include the semiconductor layer 251 and a core insulating layer 253.

A spacer insulating layer 271 may be formed on a sidewall of each of the gate stack structures GST, which is exposed by the slit 261. The spacer insulating layer 271 may be formed of an oxide layer. A bottom surface of the slit 261 is not blocked by the spacer insulating layer 271 but is exposed.

Referring to FIG. 8B, the second source layer 221 exposed through the bottom surface of the slit 261 may be etched, and the etched surface of the second source layer 221 may be oxidized. A sidewall protective layer 223 may be formed on a sidewall of the oxidized second source layer 221. Subsequently, a slit extending part 281 is formed by etching the second protective layer 219 and the multi-sacrificial layer 217, which are exposed through the slit 261. The slit extending part 281 is connected to the slit 261.

Figure 8C:
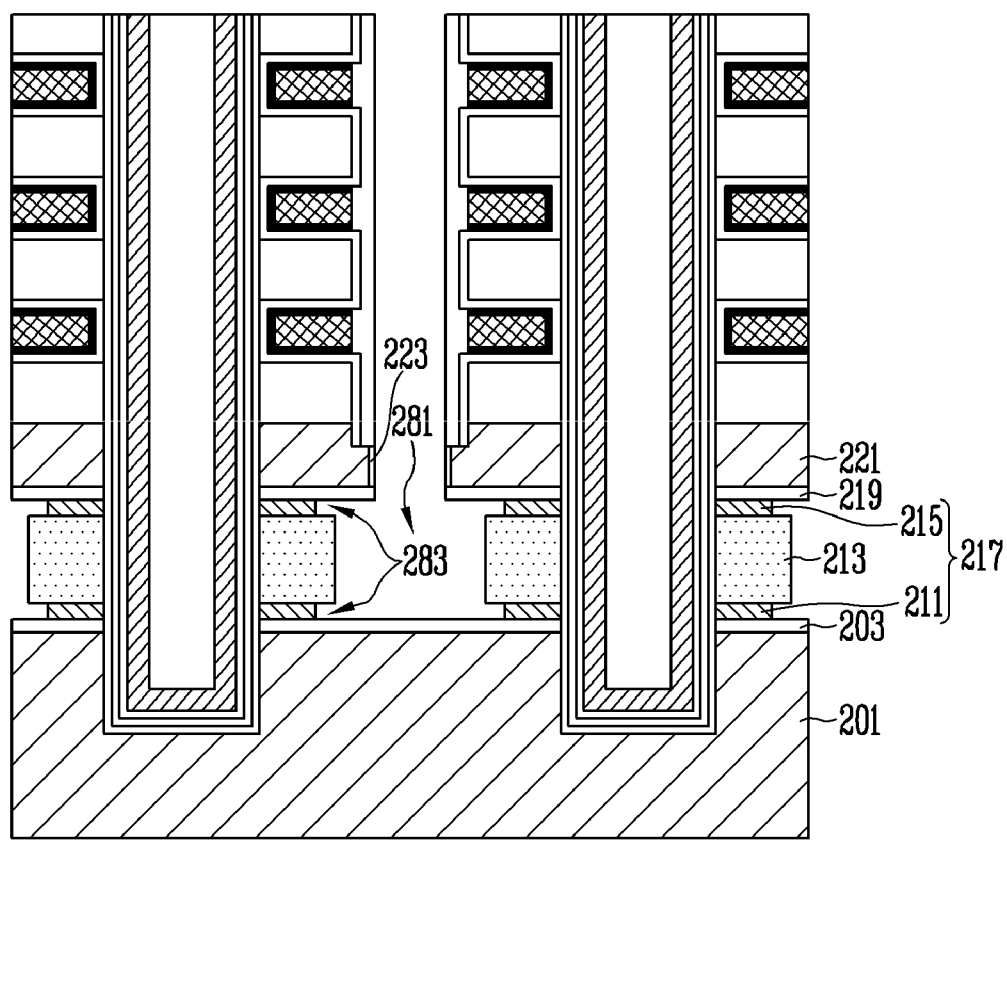

Referring to FIG. 8C, the multi-sacrificial layers 217 may be etched through the slit extending part 281, using an etching material for etching the first and third material layers 211 and 215 more quickly than the second material layer 213. In an embodiment, the first and third material layers 211 and 215 have a higher etch rate than the second material layer 213. The sidewall protective layer 223, the first protective layer 219, and the second protective layer 203 have a high etching resistance with respect to the etching material, and therefore, the multi-sacrificial layers 217 may be selectively removed during the etching process.

While the multi-sacrificial layers 217 are being selectively etched, gaps 283 may be respectively formed between the first protective layer 203 and the second material layer 213 and between the second protective layer 219 and the second material layer 213 due to a difference in etching speed between the first to third material layers 211, 213, and 215.

Each of the first material layer 211 and the third material layer 215 may include doped silicon, and the second material layer 213 may include undoped silicon. The etching material may be configured with a chemical material including hydrogen fluoride (HF), nitric acid (HNO$_3$), and acetic acid (CH$_3$COOH). The doped silicon is etched by the chemical material more quickly than the undoped silicon.

Figure 8D:
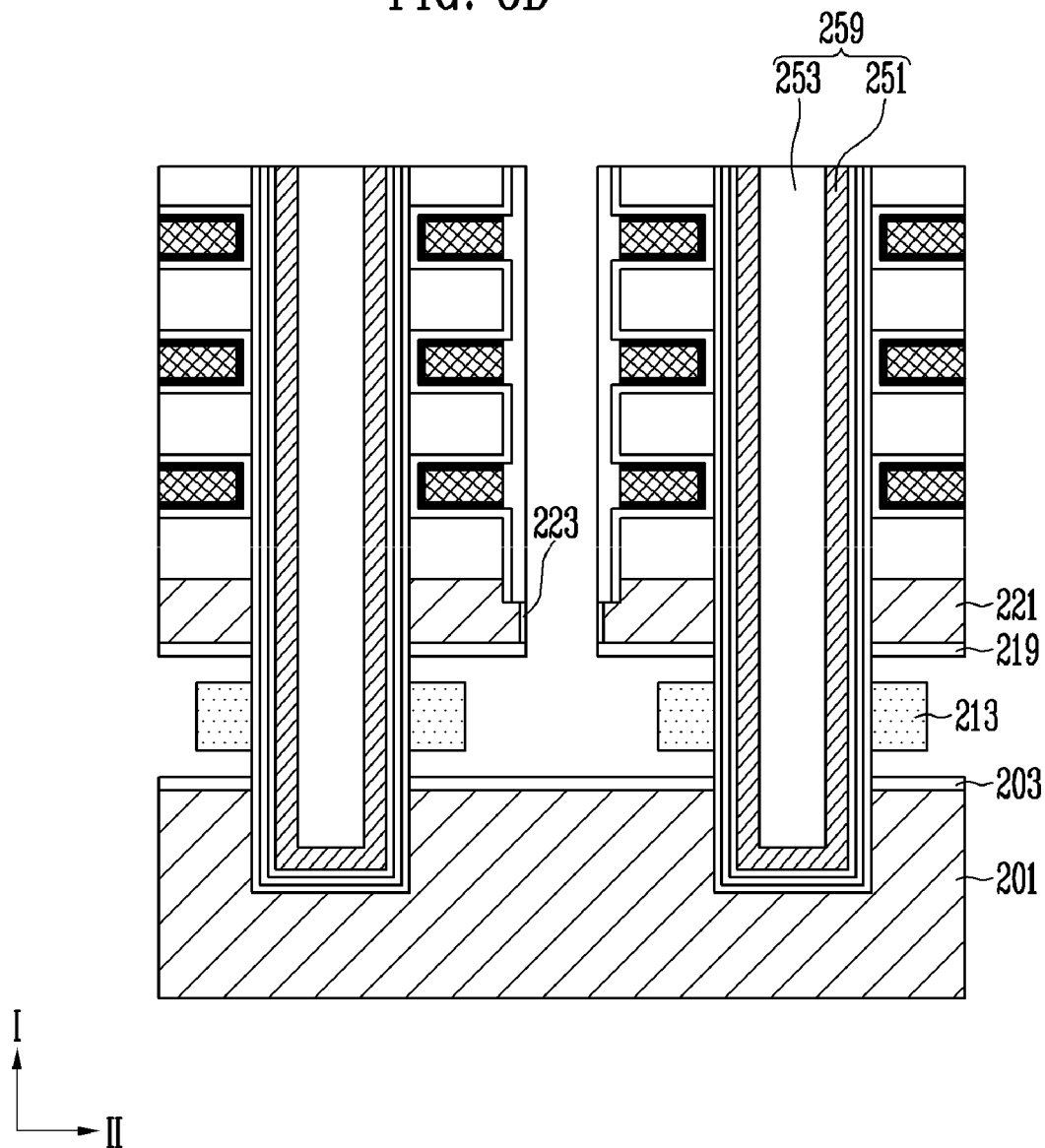

Referring to FIG. 8D, the surface area of the second material layer 213 exposed to the etching material can be enlarged through the gap 283 shown in FIG. 8C, and thus the etching speed of the second material layer 213 can be increased.

Referring to FIG. 8E, according to an embodiment, the multi-sacrificial layer is removed at high speed, so that the time required to open an interlayer space 285 between the first source layer 201 and the second source layer 221 can be reduced. While the multi-sacrificial layer is being removed, the first protective layer 203 and the second protective layer 219, which are shown in FIG. 8C, can prevent loss of the first source layer 201 and the second source layer 221. In some embodiments, opening the interlayer spaces 285 means creating a space between the second source layer 221 and the first source layer 201 after etching at least one of the first, second, and third material layers 211, 213, and 215. In other embodiments, opening the interlayer spaces 285 means creating a space between the second source layer 221 and the first source layer 201 after etching the multi-sacrificial layer 217 shown in FIGS. 8B to 8E so that a conductive source layer 287 may be formed between the second source layer 221 and the first source layer 201 (See FIG. 8F). In other embodiments, opening the interlayer spaces 285 means removing enough of the multi-sacrificial layer 217 so that an opening may be defined by the adjacent the second source layer 221, the first source layer 201, the multi-layer 249, and channel structures 259. In an embodiment, opening the interlayer spaces 285 means removing the multi-sacrificial layer 217 such that at least one surface from a surface of the second source layer 221, the first source layer 201, a surface of the multi-layer 249, and channel structure 259 is exposed.

After the multi-sacrificial layer is removed, the first source layer 201 and the second source layer 221 may be exposed by removing the first protective layer 203 and the second protective layer 219, which are shown in FIG. 8D. Accordingly, the area of the interlayer space 285 can be enlarged. While the first protective layer 203 and the second protective layer 219 are being removed, the sidewall protective layer 223 shown in FIG. 8D may be removed such that a sidewall of the second source layer 221 is exposed.

The first blocking insulating layer 243, the data storage layer 245, and the tunnel insulating layer 247, which are exposed between the first source layer 201 and the second source layer 221, may be removed such that a sidewall of each of the channel structures 259 is exposed between the first source layer 201 and the second source layer 221. Accordingly, the area of the interlayer space 285 can be enlarged. The semiconductor layer 251 of each of the channel structures 259 is exposed through the enlarged interlayer space 285.

Figure 8F:
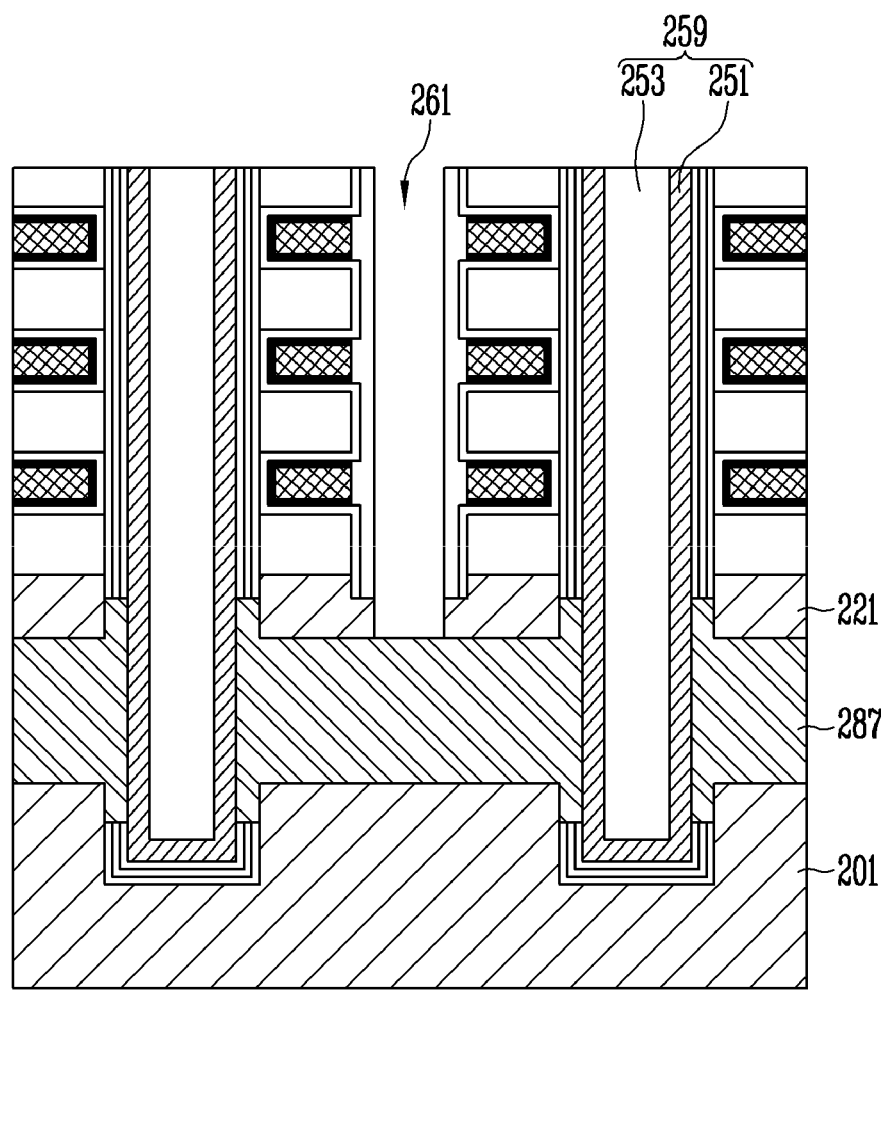

Referring to FIG. 8F, the interlayer space 285 shown in FIG. 8E is filled with the contact source layer 287. The contact source layer 287 is in direct contact with the first and second source layers 201 and 221 and the sidewalls of the channel structures 259. The contact source layer 287 may be formed of a doped silicon layer including a source dopant.

The contact source layer 287 may be formed by using a selective growth process (e.g., Selective Epitaxial Growth (SEG)) or a non-selective deposition process (e.g., Chemical Vapor Deposition (CVD)). When the selective growth process is used, the semiconductor layer 251 of each of the channel structures 259 and the first and second source layers 201 and 221 may serve as seed layers.

Subsequently, the slit 261 may be filled with the vertical structure VP described with reference to FIG. 7.

Figure 9:
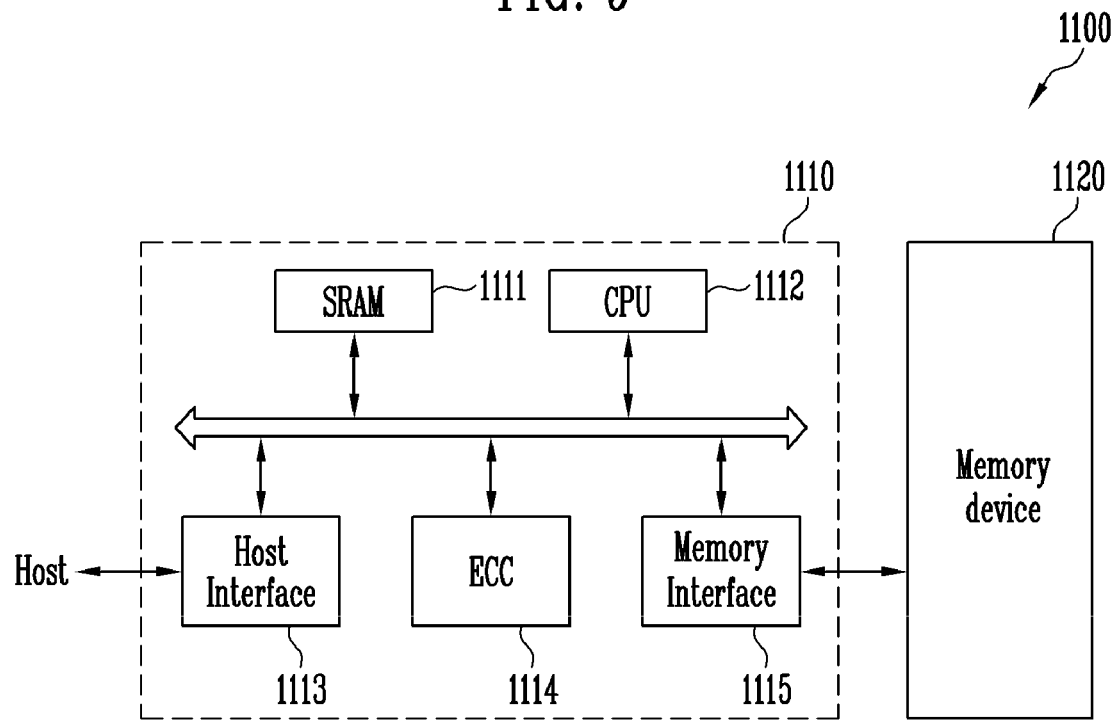
FIG. 9 is a block diagram illustrating a configuration of a memory system according to an embodiment.

FIG. 9 is a block diagram illustrating a configuration of a memory system according to an embodiment.

Referring to FIG. 9, the memory system 1100 according to an embodiment of the present disclosure includes a memory device 1120 and a memory controller 1110.

The memory device 1120 may be a multi-chip packages configured with a plurality of flash memory chips. The memory device 1120 may include at least one of the structures shown in FIGS. 4A to 4E. In an embodiment, the memory system 1100 may be formed using at least one of the manufacturing methods of forming a semiconductor device as discussed above.

The memory controller 1110 is configured to control the memory device 1120, and may include a static random access memory (SRAM) 1111, a CPU 1112, a host interface 1113, an error correction code circuit (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 10:
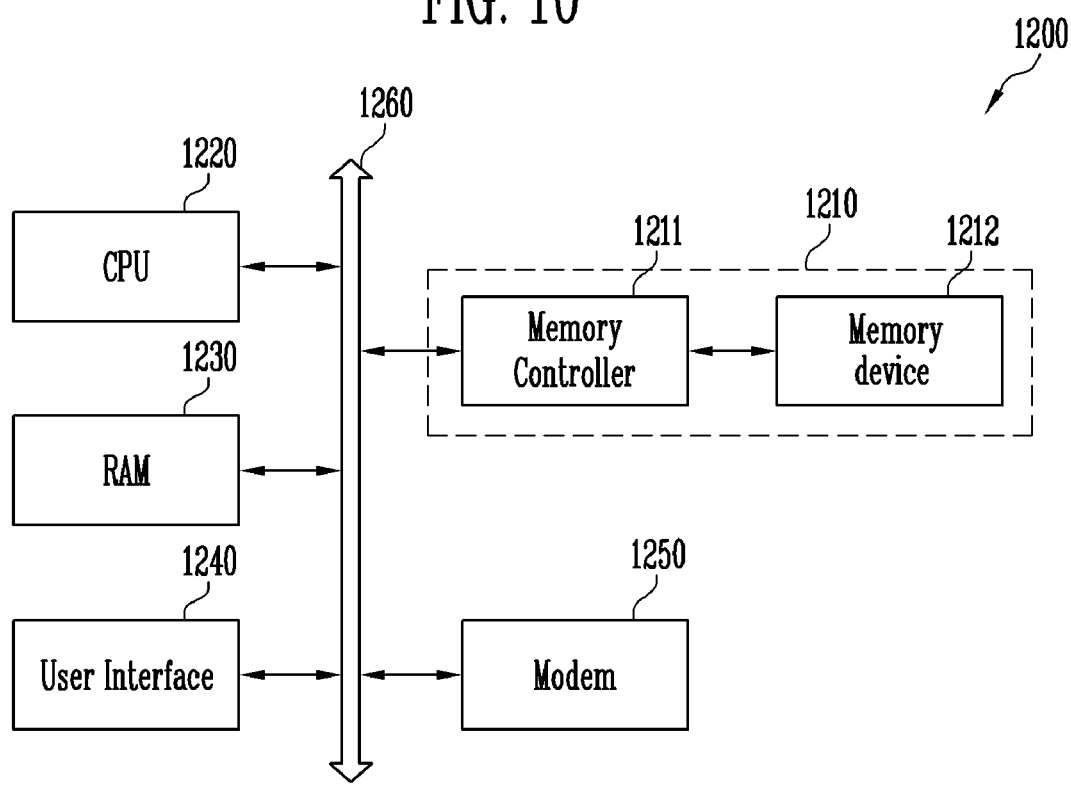
FIG. 10 is a block diagram illustrating a computing system according to an embodiment.

FIG. 10 is a block diagram illustrating a computing system according to an embodiment. In an embodiment, the computing system 1200 may be formed using at least one of the manufacturing methods of forming a semiconductor device as discussed above.

Referring to FIG. 10, the computing system 1200 according to an embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

According to the present disclosure, a sacrificial layer may be formed in a multi-layer including layers formed of different materials, so that the exposed area of the sacrificial layer can be enlarged using a difference in etching speed between the layers with respect to an etching material for removing the sacrificial layer. Accordingly, the manufacturing time of the semiconductor device can be reduced.

The embodiments of the present disclosure have been described in the drawings and specification. Although specific terminologies are used here, those are to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor device, the method comprising:
    forming a first material layer on a lower layer;
    forming a second material layer on the first material layer;
    forming a third material layer on the second material layer;
    forming an upper layer on the third material layer;
    forming a slit penetrating the upper layer and the first to third material layers;
    etching the first to third material layers through the slit, wherein the first and third material layers are etched more quickly than the second material layer such that a first gap is formed between the upper layer and the second material layer and a second gap is formed between the lower layer and the second material layer; and
    removing the second material layer through the slit, the first gap and the second gap.

2. The method of claim 1, wherein the third material layer is comprised of the same material as the first material layer and the second material layer is different from the first material layer.

3. The method of claim 1,
    wherein the second material layer is formed thicker than the first material layer, and
    wherein the second material layer is formed thicker than the third material layer.

4. The method of claim 1, wherein each of the first material layer and the third material layer includes at least one of a Boron Phosphorus Silicate Glass (BPSG), an Undoped Silicate Glass (USG), a Phosphorus Silicate Glass (PSG), and a porous nitride layer, and
    the second material layer includes a silicon nitride layer, and
    wherein etching the first to third material layers comprises removing the first to third material layers by providing an etching material including phosphoric acid ($H_3PO_4$) through the slit.

5. The method of claim 1, wherein etching the first to third material layers comprises forming an interlayer space between the upper layer and the lower layer.

6. The method of claim 5, further comprising filling the interlayer space with a fourth material layer.

7. A method of manufacturing a semiconductor device, the method comprising:
forming a stack structure in which an interlayer insulating layer and a multi-sacrificial layer are alternately stacked, wherein the multi-sacrificial layer is formed by stacking a first material layer and a second material layer;
forming channel structures penetrating the stack structure;
forming a slit penetrating the stack structure between the channel structures;
etching the multi-sacrificial layer through the slit, wherein the first material layer is etched more quickly than the second material layer to expose a surface of the second material layer by a qap defined between the interlayer insulating layer and the second material layer;
removing a remaining portion of the multi-sacrificial layer through the gap and the slit; and
filling a region in which the multi-sacrificial layer is removed with a conductive pattern.

8. The method of claim 7, wherein the second material layer is formed thicker than the first material layer.

9. The method of claim 7, wherein the first material layer includes at least one of a Boron Phosphorus Silicate Glass (BPSG), an Undoped Silicate Glass (USG), a Phosphorus Silicate Glass (PSG), and a porous nitride layer, and
the second material layer includes a silicon nitride layer, and
wherein etching the multi-sacrificial layer comprises removing the first and second material layers by providing an etching material including phosphoric acid ($H_3PO_4$) through the slit.

10. The method of claim 7,
wherein the multi-sacrificial layer further includes a third material layer, and
wherein the second material layer is disposed between the first material layer and the third material layer.

11. The method of claim 10,
wherein the second material layer is formed thicker than the first material layer, and
wherein the second material layer is formed thicker than the third material layer.

12. The method of claim 10, wherein each of the first material layer and the third material layer includes at least one of a Boron Phosphorus Silicate Glass (BPSG), an Undoped Silicate Glass (USG), a Phosphorus Silicate Glass (PSG), and a porous nitride layer, and
the second material layer includes a silicon nitride layer, and
wherein etching the multi-sacrificial layer comprises removing the first to third material layers by providing an etching material including phosphoric acid ($H_3PO_4$) through the slit.

13. The method of claim 10, wherein the third material layer is comprised of the same material as the first material layer.

14. A method of manufacturing a semiconductor device, the method comprising:
forming a stack structure in which a source layer and a multi-sacrificial layer are alternately stacked, wherein the multi-sacrificial layer is formed by stacking a first material layer and a second material layer;
forming gate stack structures penetrated by channel structures on the stack structure;
forming a slit penetrating the multi-sacrificial layer exposed between the gate stack structures;
etching the multi-sacrificial layer, wherein the first material layer is etched more quickly than the second material layer to expose a surface of the second material layer by a gap defined between the source layer and the second material layer;
removing a remaining portion of the multi-sacrificial layer through the gap and the slit; and
filling a region in which the multi-sacrificial layer is removed with a contact source layer.

15. The method of claim 14, wherein the channel structures penetrate the multi-sacrificial layer and extend to the inside of the source layer,
a sidewall of each of the channel structures is exposed through the region in which the multi-sacrificial layer is removed, and
the contact source layer is in contact with the sidewall of each of the channel structures.

16. The method of claim 14, wherein the second material layer is formed thicker than the first material layer.

17. The method of claim 14, wherein the first material layer includes doped silicon, and
the second material layer includes undoped silicon, and
wherein etching the multi-sacrificial layer comprises removing the first and second material layers by providing an etching material, which is configured with a chemical material including hydrogen fluoride (HF), nitric acid ($HNO_3$), and acetic acid ($CH_3COOH$), through the slit.

18. The method of claim 14, wherein the multi-sacrificial layer further includes a third material layer,
wherein the second material layer is disposed between the first material layer and the third material layer.

19. The method of claim 18,
wherein the second material layer is formed thicker the first material layer, and
wherein the second material layer is formed thicker than the third material layer.

20. The method of claim 18, wherein each of the first material layer and the third material layer includes doped silicon, and
the second material layer includes undoped silicon, and
wherein etching the multi-sacrificial layer comprises removing the first and second material layers by providing an etching material, which is configured with a chemical material including hydrogen fluoride (HF), nitric acid ($HNO_3$), and acetic acid ($CH_3COOH$), through the slit.

21. The method of claim 18, wherein the third material layer is comprised of the same material as the first material layer.

22. A method of manufacturing a semiconductor device, the method comprising:
forming a first material layer on a lower layer;
forming a second material layer on the first material layer;
forming a third material layer on the second material layer;
forming an upper layer on the third material layer;
forming a slit penetrating the upper layer and the first to third material layers; and
etching the first to third material layers through the slit, wherein the first and third material layers are etched more quickly than the second material layer such that a first gap is formed between the upper layer and the second material layer and a second gap is formed between the lower layer and the second material layer,
wherein each of the first material layer and the third material layer includes doped silicon, and
the second material layer includes undoped silicon, and wherein etching the first to third material layers comprises removing the first to third material layers by providing an etching material, which is configured with a chemical material including hydrogen fluoride (HF), nitric acid ($HNO_3$), and acetic acid ($CH_3COOH$), through the slit.

* * * * *